(12) United States Patent
Hwang

(10) Patent No.: US 9,041,063 B2
(45) Date of Patent: May 26, 2015

(54) HIGH ELECTRON MOBILITY TRANSISTORS AND METHODS OF MANUFACTURING THE SAME

(75) Inventor: In-jun Hwang, Hwaseong-si (KR)

(73) Assignee: SAMSUNG ELECTRONCS CO., LTD. (KR)

(*) Notice: Subject to any disclaimer, the term of this patent is extended or adjusted under 35 U.S.C. 154(b) by 0 days.

(21) Appl. No.: 13/064,287

(22) Filed: Mar. 16, 2011

(65) Prior Publication Data

US 2011/0272741 A1 Nov. 10, 2011

(30) Foreign Application Priority Data

May 4, 2010 (KR) ........................ 10-2010-0042069

(51) Int. Cl.
| | |
|---|---|
| *H01L 29/66* | (2006.01) |
| *H01L 29/778* | (2006.01) |
| *H01L 29/10* | (2006.01) |
| *H01L 29/423* | (2006.01) |
| *H01L 29/20* | (2006.01) |

(52) U.S. Cl.
CPC ........ *H01L 29/7787* (2013.01); *H01L 29/1029* (2013.01); *H01L 29/2003* (2013.01); *H01L 29/42316* (2013.01); *H01L 29/66462* (2013.01)

(58) Field of Classification Search
USPC ............... 257/192, 194, 195, 196, 410, 411, 257/E29.246, E29.247, E29.252; 438/167, 438/172
See application file for complete search history.

(56) References Cited

U.S. PATENT DOCUMENTS

| | | | |
|---|---|---|---|
| 7,170,111 B2 | 1/2007 | Saxler | |
| 7,332,795 B2 | 2/2008 | Smith et al. | |
| 7,612,390 B2 | 11/2009 | Saxler et al. | |
| 2007/0228416 A1 | 10/2007 | Chen et al. | |
| 2007/0254418 A1 | 11/2007 | Sheppard et al. | |
| 2007/0278518 A1 | 12/2007 | Chen et al. | |
| 2007/0295993 A1 | 12/2007 | Chen et al. | |
| 2008/0006845 A1 | 1/2008 | Derluyn et al. | |

(Continued)

FOREIGN PATENT DOCUMENTS

| | | |
|---|---|---|
| JP | 06-204258 | 7/1994 |
| JP | 09172163 A | 6/1997 |

(Continued)

OTHER PUBLICATIONS

Song, et al., "High Off AlGaN/GaN Low-Density Drain Hemt (LDD-HEMT) With Enhanced Breakdown Voltage and reduced Current Collapse", IEEE Electron Device Letters, vol. 28, No. 3, Mar. 2007.

(Continued)

*Primary Examiner* — Su C Kim
(74) *Attorney, Agent, or Firm* — Harness, Dickey & Pierce, PLC

(57) ABSTRACT

High electron mobility transistors (HEMTs) and methods of manufacturing the same. A HEMT may include a source electrode, a gate electrode, a drain electrode, a channel formation layer including at least a 2-dimensional electron gas (2DEG) channel, a channel supplying layer for forming the 2DEG channel in the channel formation layer, a portion of the channel supplying layer including a first oxygen treated region. The channel supplying layer may include a second oxygen treated region that extends from the first oxygen treated region towards the drain electrode, and the depth and concentration of oxygen of the second oxygen treated region may be less than those of the first oxygen treated region.

24 Claims, 25 Drawing Sheets

(56) References Cited

U.S. PATENT DOCUMENTS

| | | | |
|---|---|---|---|
| 2009/0267078 A1 | 10/2009 | Mishra et al. | |
| 2009/0283756 A1* | 11/2009 | Hellings et al. | 257/24 |
| 2010/0012977 A1* | 1/2010 | Derluyn et al. | 257/194 |
| 2010/0102359 A1* | 4/2010 | Khan et al. | 257/194 |
| 2011/0057257 A1 | 3/2011 | Park et al. | |
| 2011/0303952 A1* | 12/2011 | Hwang et al. | 257/194 |
| 2012/0098599 A1* | 4/2012 | Chang et al. | 330/277 |

FOREIGN PATENT DOCUMENTS

| | | |
|---|---|---|
| JP | 09246527 A | 9/1997 |
| JP | 10335638 A | 12/1998 |
| JP | 11177080 A | 7/1999 |
| KR | 10-2004-0018502 | 3/2004 |
| KR | 1020090091868 | 8/2009 |

OTHER PUBLICATIONS

Ostermaier, et al., "Ultrathin InAlN/AlN Barrier HEMT With High Performance in Normally Off Operation", IEEE Electron Device Letters, vol. 30, No. 10, Oct. 2009.

Onojima, et al.; "Reduction in Potential Barrier Height of AlGaN/GaN heterostructures by SiN Passivation", Journal of Applied Physics 101, (2007).

Ibbetson, et al., "Polarization Effects, Surface States, and the Source of Electrons in AlGaN/GaN Heterostructure Field Effect Transistors", Applied Physics Letters, vol. 77, No. 2 (pp. 250-252), Jul. 10, 2000.

Shealy, et al., "Growth and Passivation of AlGaN/GaN Heterostructures", Journal of Crystal Growth 250 (pp. 7-13), (2003).

US Office Action dated Aug. 6, 2013 for related U.S. Appl. No. 13/151,475.

Uemoto et al., "Gate Injection Transistor (GIT)—A Normally-Off AlGaN/GaN Power Transistor Using conductivity Modulation", IEEE Transactions on Electron Devices, vol. 54 No. 12, Dec. 2007, pp. 3393-3399.

Saito et al., "Recessed-Gate Struture Approach Toward Normally Off High-Voltage AlGaN/GaN HEMT for Power Electronics Applications", IEEE Transactions on Electron Devices, vol. 53, No. 2, Feb. 2006, pp. 356-362.

\* cited by examiner

HIGH ELECTRON MOBILITY TRANSISTORS AND METHODS OF MANUFACTURING THE SAME

CROSS-REFERENCE TO RELATED APPLICATION

This application claims priority under 35 U.S.C. §119 to Korean Patent Application No. 10-2010-0042069, filed on May 4, 2010, in the Korean Intellectual Property Office (KIPO), the entire contents of which is incorporated herein by reference.

BACKGROUND

1. Field

Example embodiments relate to high electron mobility transistors (HEMTs) and methods of manufacturing the same, and more particularly to HEMTs including oxygen treated regions and methods of manufacturing the same.

2. Description of the Related Art

A high electron mobility transistor (HEMT) includes semiconductors with different band gaps. In a HEMT, semiconductors with different band gaps are joined together. A semiconductor with a relatively wide band gap functions as a donor. Such a semiconductor with the relatively wide band gap forms a 2-dimensional electron gas (2DEG) in a semiconductor with a relatively narrow band gap. In a HEMT, the 2DEG may be used as a channel.

A HEMT may be a transistor with improved charge carrier mobility and a high breakdown voltage, and may act as a power device. The relatively wide band gap semiconductor may be a compound semiconductor. Therefore, a breakdown voltage of a HEMT may be high. A 2DEG may be formed by n-doping a material having a relatively wide band gap or by using a polarized material. Because a HEMT includes a channel without application of an external electric field, the HEMT operates in a depletion mode.

However, in order to simplify a circuit, a HEMT may operate in an enhancement mode (hereinafter, referred to as an 'E-mode'). The E-mode may be realized by removing a channel disposed below a gate. In a HEMT, the 2DEG between a gate and a drain is removed during a turning-off operation. A space charge remains and an electric field is concentrated at the gate due to the space charge. Due to the concentration of the electric field at the gate, the breakdown voltage of the HEMT may decrease.

In order to realize an E-mode and/or increase a breakdown voltage of a HEMT, the polarizability of a channel supplying layer may be reduced by etching a portion of the channel supplying layer using chlorine (Cl) based gases, or fluorine (F) based gases may be put into the channel layer to function as an acceptor. However, because both Cl and F produce corrosive gases the HEMT may be damaged during the etching of the channel supplying layer.

SUMMARY

Example embodiments may provide high electron mobility transistors (HEMTs) for realizing an enhancement mode (E-mode) under conditions which the HEMTs may not be damaged while being etched, and/or for increasing a breakdown voltage, and methods of manufacturing the HEMTs.

According to example embodiments, a high electron mobility transistor (HEMT) includes a source electrode, a gate electrode, a drain electrode, a channel formation layer including at least a 2-dimensional electron gas (2DEG) channel and a channel supplying layer for forming the 2DEG channel in the channel formation layer, a portion of the channel supplying layer including an oxygen treated region.

The channel supplying layer may include a second oxidized region between the gate electrode and the drain electrode. The HEMT may include at least one of a channel increasing layer and an insulating layer for improving insulating property of the gate electrode, which are formed on the channel supplying layer. The channel increasing layer may include a Group IV semiconductor, a compound of the Group IV semiconductor, an n-type semiconductor, or a dielectric material. The insulating layer may be an $Al_2O_3$ layer, a $SiO_2$ layer or a SiN layer.

A depth or concentration of oxygen of the second oxygen treated region may be less than a depth or concentration of oxygen of the first oxygen treated region. At least part of the oxygen treated region may be covered by the insulating layer. The HEMT may further include a semiconductor layer having less polarizability than polarizability of the channel supplying layer, the semiconductor layer may be formed between the gate electrode and the channel supplying layer, and at least one of the first oxygen treated region and the second oxygen treated region may extend into the semiconductor layer. The HEMT may further include a semiconductor layer having greater polarizability than polarizability of the channel formation layer and being formed below the channel formation layer. The HEMT may further include a semiconductor layer having greater polarizability than polarizability of the channel formation layer, and the semiconductor layer may be formed below the channel formation layer.

The HEMT may further include a semiconductor layer having less polarizability than polarizability of the channel supplying layer, the semiconductor layer formed between the channel supplying layer and at least one of the channel increasing layer and the insulating layer, and at least part of the oxygen treated region may extend into at least one of the channel increasing layer and the insulating layer through the semiconductor layer. The HEMT may further include a semiconductor layer having greater polarizability than polarizability of the channel formation layer, and the semiconductor layer may be formed below the channel formation layer.

According to example embodiments, a method of manufacturing a high electron mobility transistor (HEMT) includes forming a channel formation layer in which at least a 2-dimensional electron gas (2DEG) channel is formed, on a substrate, forming a channel supplying layer for forming the 2DEG channel on the channel formation layer, forming a source electrode and a drain electrode on the channel supplying layer so as to be spaced apart from each other, forming an oxygen treated region on the channel supplying layer between the source electrode and the drain electrode, and forming a gate electrode on at least one of the oxygen treated region, and the channel supplying layer between the oxygen treated region and the source electrode.

The forming of the oxygen treated region may include forming a first oxygen treated region; and forming a second oxygen treated region, and depths or concentration of oxygen of the first and second oxygen treated regions may be different from each other. In addition, the first and second oxygen treated regions may be formed to partially overlap each other. The method may further include, prior to the forming of the gate electrode, forming at least one of a channel increasing layer and an insulating layer for improving insulating property of the gate electrode on the channel supplying layer. In this case, the channel increasing layer may include a Group IV semiconductor, a compound of the Group IV semiconductor, an n-type semiconductor, or a dielectric material. The insulating layer may be an $Al_2O_3$ layer, a $SiO_2$ layer or a SiN layer.

A depth or concentration of oxygen of the second oxygen treated region may be less than a depth or concentration of oxygen of the first oxygen treated region, and the gate electrode may be formed on the first oxygen treated region. The method may further include, prior to the forming of the gate electrode, forming a semiconductor layer having less polarizability than polarizability of the channel supplying layer on the channel supplying layer. The oxygen treated region may be formed through the semiconductor layer. In this case, the channel formation layer may be formed on a semiconductor layer having greater polarizability than polarizability of the channel formation layer.

The method may further include, prior to the forming of the at least one of the channel increasing layer and the insulating layer, forming a semiconductor layer having less polarizability than polarizability of channel supplying layer on the channel supplying layer. In this case, the channel formation layer may be formed on a semiconductor layer having greater polarizability than polarizability of the channel formation layer. The oxygen treated region may be formed by using any one of $O_2$ plasma, $O_2$ annealing, $O_3$, ultraviolet (UV) oxidation, O radical and O implant.

In the HEMT, a channel supplying layer may include an oxygen treated region. The oxygen treated region may be an oxidized region. According to the depth of the oxygen treated region and concentration of oxygen of the oxygen treated region, a 2DEG channel positioned below the oxygen treated region may be removed, or the concentration of electrons contained in the 2DEG channel may be reduced. The HEMT may operate in an enhancement mode ('E-mode'), and may have high breakdown voltage. The oxygen treated region may include oxygen ions that function as acceptors of the electrons contained in the 2DEG channel. An electric field may be prevented from being concentrated at a gate electrode of the HEMT. In addition, because the oxygen treated region is formed after an insulating layer is formed on the channel supplying layer, the HEMT may be prevented from being damaged during etching. After the oxygen treated region is formed, a gate electrode may be formed by using a self-align operation, and the insulating layer may be formed by using an in-situ process, thereby simplifying manufacturing processes.

According to example embodiments, a high electron mobility transistor includes a channel layer, a channel supplying layer configured to induce a 2-dimensional electron gas (2DEG) channel in the channel layer, a source electrode, a gate electrode and a drain electrode on the channel layer and the channel supplying layer and an oxygenated region including a part of at least the channel supplying layer of the transistor, the oxygenated region adjacent to the gate electrode.

According to example embodiments, a method of manufacturing a high electron mobility transistor includes forming a channel layer on a substrate, forming a channel supplying layer on the channel layer to induce a 2-dimensional electron gas (2DEG) channel in the channel layer, forming a source electrode and a drain electrode on the channel supplying layer, the source and drain electrodes spaced apart from each other, forming an oxygenated region on the channel supplying layer between the source electrode and the drain electrode and forming a gate electrode on at least one of the oxygenated region and a region of the channel supplying layer between the oxygenated region and the source electrode.

BRIEF DESCRIPTION OF THE DRAWINGS

Example embodiments will be more clearly understood from the following brief description taken in conjunction with the accompanying drawings.

FIGS. 1-34 are cross-sectional diagrams illustrating high electron mobility transistors (HEMTs) according to example embodiments;

FIGS. 59-61 are graphs showing simulation results of performing oxygen treatment on a HEMT including a channel increasing layer according to example embodiments.

Figure 1:
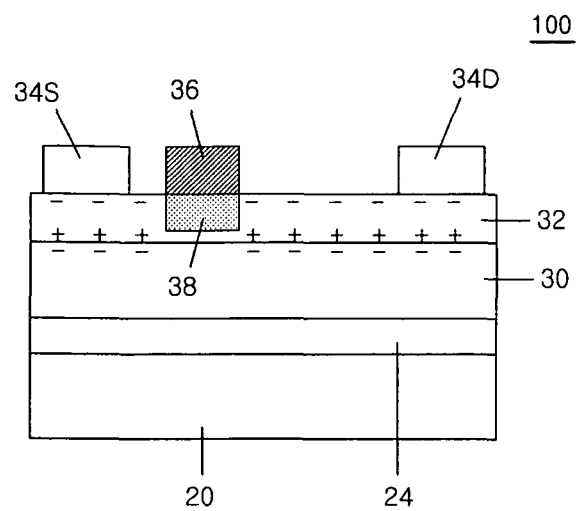
FIGS. 1-61 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is cross-sectional diagram illustrating a high electron mobility transistor (HEMT) 100 according to example embodiments. Referring to FIG. 1, the HEMT 100 may include a substrate 20, a buffer layer 24, a first material layer 30, a second material layer 32, a source electrode 34S, a drain electrode 34D, a gate electrode 36 and a first oxidized region 38. The buffer layer 24 may be on the substrate 20. The first material layer 30 and a second material layer 32 may be on the buffer layer 24 (e.g., sequentially stacked on the buffer layer 24).

The substrate 20 may be, for example, a sapphire substrate. The buffer layer 24 may be, for example, an AlN layer. The first material layer 30 and the second material layer 32 may be a semiconductor layers with different polarizabilities and different band gaps. The polarizability and band gap of the first material layer 30 may be less than the polarizability and band gap of the second material layer 32. The first material layer 30 may be a semiconductor layer, for example, a GaN layer and/or an InGaN layer. The second material layer 32 may be a semiconductor layer, for example, an AlGaN layer. The second material layer 32 may be, for example, an AlN layer.

According to a polarizability difference between the first and second material layers 30 and 32, the second material layer 32 may be polarized. Charges (+ and −) of the second material layer 32 may indicate polarized charges. Charges (−) that are shown under a surface of the first material layer 30 which contacts the second material layer 32 may indicate 2-dimensional electron gas (2DEG). The 2DEG may form in order to offset charges (+) arising due to polarization of the second material layer 32. The 2DEG may be used as an n-channel.

Because the 2DEG channel may arise in the first material layer 30 due to the second material layer 32, the second material layer 32 may be a channel supplying layer for inducing the 2DEG channel in the first material layer 30 having less polarizability (or smaller band gap) than that of the second material layer 32. Because a 2DEG channel induced by the second material layer 32 as a channel supplying layer may be induced in the first material layer 30, the first material layer 30 may include the 2DEG channel. The first material layer 30 may be a channel formation layer or a channel layer in which a 2DEG channel is formed.

The source electrode 34S, the gate electrode 36 and the drain electrode 34D may be spaced apart from one another on the second material layer 32. The drain electrode 34D may be spaced farther apart from the gate electrode 36 than the source electrode 34S. A first oxidized region 38 may be in the second material layer 32. The first oxidized region 38 may be oxygen-treated by using various methods. The first oxidized region 38 may be referred to as an oxygen treated region. The first oxidized region 38 may be below the gate electrode 36 and may extend in a downwards direction from a top surface. According to a depth of the first oxidized region 38 in the second material layer 32 and/or the concentration of oxygen contained in the first oxidized region 38, the 2DEG channel below the first oxidized region 38, and/or the concentration of electrons contained in the 2DEG channel may be reduced. Upon complete removal of the 2DEG channel below the first oxidized region 38, a HEMT may be an enhancement mode HEMT (hereinafter, referred to as an 'E-mode'). Upon reduction of the concentration of electrons contained in the 2DEG channel, the 2DEG channel induced below the first oxidized region 38 may be a lightly doped drain (LDD) region and a breakdown voltage of a HEMT may increase.

The first oxidized region 38 may be spaced apart from a bottom surface of the second material layer 32. The second material layer 32 and the first oxidized region 38 may be between the gate electrode 36 and the first material layer 30. Between the gate electrode 36 and the first material layer 30, the thickness of the first oxidized region 38 may be greater than the thickness of the second material layer 32. The first oxidized region 38 may contain oxygen. The first oxidized region 38 may include one or more oxides arising due to oxygen-treating a portion corresponding to the first oxidized region 38 of the second material layer 32. The first oxidized region 38 may be region including an oxide of the second material layer 32, for example, an aluminum (Al) oxide. The first oxidized region 38 may contain oxygen ions that function as acceptors with respect to electrons contained in the 2DEG channel.

The polarizability of the first oxidized region 38 may be less than that of the remaining portion of the second material layer 32. The concentration of oxygen contained in the first oxidized region 38 may be the concentration of oxygen ions contained in the first oxidized region 38. The amount of a polarization-induced element contained in the first oxidized region 38 may be less than the amount of a polarization-induced element contained in a remaining portion of the second material layer 32. A polarizability difference between the first oxidized region 38 and the first material layer 30 may be less than a polarizability difference between the remaining portion of the second material layer 32 and the first material layer 30.

The concentration of a 2DEG of a portion of the first material layer 30 positioned below the gate electrode 36 may decrease due to the addition of oxygen. When the first oxidized region 38 contains oxygen ions functioning as acceptors electrons contained in a 2DEG channel may be accepted by the oxygen ions. The concentration of electrons contained in the 2DEG channel of the portion of the first material layer 30 positioned below the gate electrode 36 may be reduced. Because the first oxidized region 38 is in the second material layer 32, the concentration of 2DEG may be reduced in a portion below the gate electrode 36 to form an LDD region. A breakdown voltage of the HEMT may increase.

Figure 2:
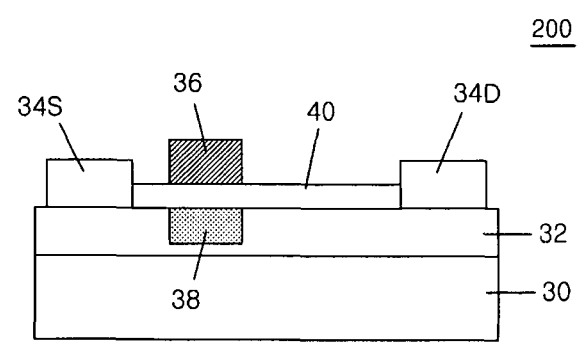

FIG. 2 is cross-sectional diagram illustrating a HEMT 200 according to example embodiments. Referring to FIG. 2, an insulating layer 40 may be on a second material layer 32 between a source electrode 34S and a drain electrode 34D. The insulating layer 40 may increase an on-current of the HEMT 200. The insulating layer 40 may contact the source electrode 34S and the drain electrode 34D. The insulating layer 40 may be, for example, an $Al_2O_3$ layer, a $SiO_2$ layer, and/or a SiN layer. The thickness of the insulating layer 40 may be, for example, about 1 nm to about 50 nm. The gate electrode 36 may be on the insulating layer 40. The gate electrode 36 and the first oxidized region 38 may face each other, and the insulating layer 40 may be between the gate electrode 36 and the first oxidized region 38.

In FIG. 2 and other figures, the substrate 20 and the buffer layer 24 described with respect to FIG. 1 may be included but may not be shown for convenience of illustration. Further, charges induced in the first and second material layers 30 and 32 may not be shown for convenience of illustration.

Figure 3:
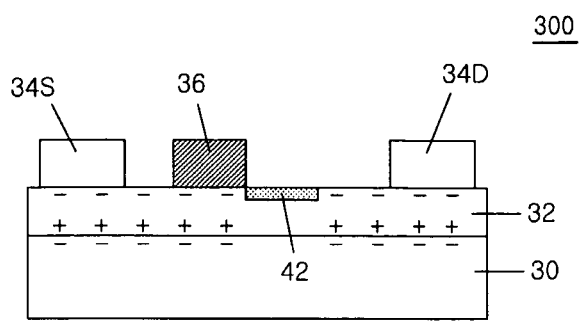

FIG. 3 is cross-sectional diagram illustrating a HEMT 300 according to example embodiments. Referring to FIG. 3, a second oxidized region 42 may be in a second material layer 32. The second oxidized region 42 may be between a gate electrode 36 and a drain electrode 34D. The second oxidized region 42 may contact the gate electrode 36. The second oxidized region 42 may be a region including an aluminum (Al) oxide (e.g., an oxidized portion of the second material layer 32) or a region that contains oxygen ions functioning as acceptors. The depth and concentration of oxygen of the second oxidized region 42 may be less than that of the first oxidized region 38 of FIG. 1. A function of the second oxidized region 42 may be similar to that of the first oxidized region 38. The concentration of electrons contained in a 2DEG formed in a portion of the first material layer 30, which is positioned below the second oxidized region 42, may be less than that of the remaining portion of the first material layer 30. A breakdown voltage of the HEMT may increase.

Figure 4:
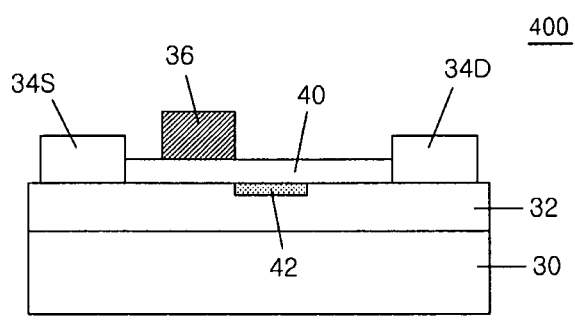

FIG. 4 is cross-sectional diagram illustrating a HEMT 400 according to example embodiments. The HEMT 400 of FIG. 4 may be similar to the HEMT 300 of FIG. 3 and include the insulating layer 40 of FIG. 2. Referring to FIG. 4, a second oxidized region 42 may be in a second material layer 32. An insulating layer 40 may be between a source electrode 34S and a drain electrode 34D. The arrangement and material of the insulating layer 40 may be the same or similar to that described with respect to FIG. 2. A gate electrode 36 may be on the insulating layer 40. The gate electrode 36 and the second oxidized region 42 may not directly contact each other.

Figure 5:
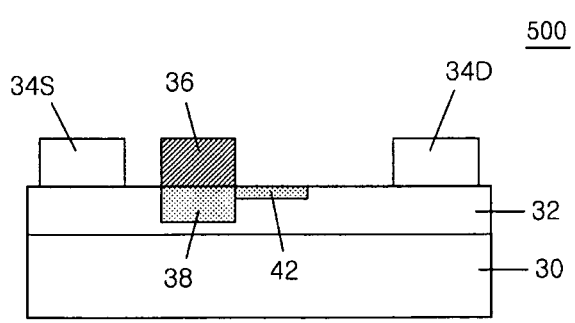

FIG. 5 is cross-sectional diagram illustrating a HEMT 500 according to example embodiments. FIG. 5 may illustrate first and second oxidized regions 38 and 42 in a second material layer 32. Referring to FIG. 5, the second material layer 32 may include the first oxidized region 38 and the second oxidized region 42. Locations of the first and second oxidized regions 38 and 42 with respect to the gate electrode 36 may be the same or similar to that of FIGS. 1 and 3. The second oxidized region 42 may be thinner than the first oxidized region 38. The second oxidized region 42 may contact the first oxidized region 38. A 2DEG channel may be below the second oxidized region 42 and may be an LDD region due to the second oxidized region 42. In an off state of the HEMT 500, an electric field may be prevented and/or reduced and may not concentrate at a gate electrode 36 due to space charges between a gate electrode 36 and a drain electrode 34D. A breakdown voltage may increase.

Figure 6:
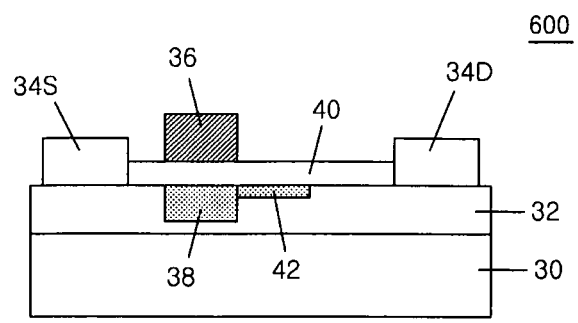

FIG. 6 is cross-sectional diagram illustrating a HEMT 600 according to example embodiments. The HEMT 600 may be similar to the HEMT 500 of FIG. 5 and include an insulating layer 40 for increasing an on-current. Referring to FIG. 6, the insulating layer 40 may be between a source electrode 34S and a drain electrode 34D. The positional relationship of the insulating layer 40, a gate electrode 36, and the source and drain electrodes 34S and 34D may be the same or similar to above-described example embodiments. The gate electrode 36 and the first and second oxidized regions 38 and 42 may not directly contact each other due to the insulating layer 40.

Figure 7:
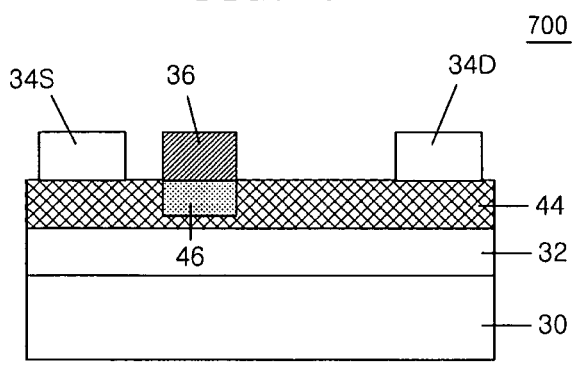

FIG. 7 is cross-sectional diagram illustrating a HEMT 700 according to example embodiments. Referring to FIG. 7, a channel increasing layer 44 may be on a second material layer 32. A source electrode 34S, a gate electrode 36 and a drain electrode 34D may be spaced apart from one another on the channel increasing layer 44. The channel increasing layer 44 may increase the concentration of a 2DEG in the first material layer 30. Due to the channel increasing layer 44, an on-current may increase. The channel increasing layer 44 may include a third oxidized region 46 below the gate electrode 36. The third oxidized region 46 may be similar to the first oxidized region 38 of FIG. 1 and may perform the same or similar function as that of the first oxidized region 38 of FIG. 1. The positional relationship between the third oxidized region 46 and the gate electrode 36 may be the same or similar to that of the first oxidized region 38 and the gate electrode 36 of FIG. 1.

Figure 13:
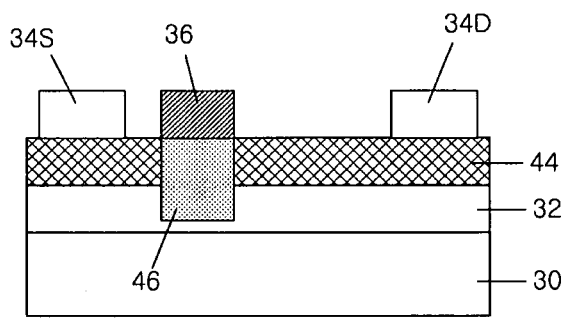

Due to the channel increasing layer 44 an on-current may increase. Due to the third oxidized region 46, a breakdown voltage of the HEMT 700 may be the same or similar as example embodiments not including the channel increasing layer 44. The channel increasing layer 44 may include, for example, a Group IV semiconductor, a compound of a Group IV semiconductor, an n-type semiconductor or a dielectric material. Examples of Group IV semiconductors may include carbon (C), silicon (Si), and/or germanium (Ge). The Group IV semiconductor may be a nitride, for example, CN, SiN or GeN. The third oxidized region 46 may extend into the second material layer 32, as illustrated in FIG. 13, and the effect of reducing the concentration of electrons contained in a 2DEG channel due to the third oxidized region 46 may be increased.

Figure 8:
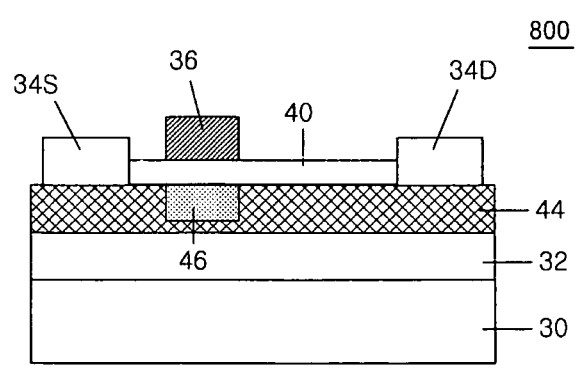
Figure 14:
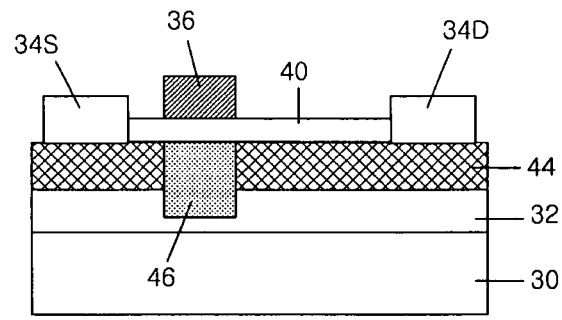

FIG. 8 is cross-sectional diagram illustrating a HEMT 800 according to example embodiments. The HEMT 800 of FIG. 8 may be similar to the HEMT 700 of FIG. 7 and may include an insulating layer 40. Referring to FIG. 8, the insulating layer 40 may be on a channel increasing layer 44 between a source electrode 34S and a drain electrode 34D. The insulating layer 40 may contact the source and drain electrodes 34S and 34D. A gate electrode 36 may be on the insulating layer 40. The gate electrode 36 may not directly contact the third oxidized region 46. The third oxidized region 46 may extend into the second material layer 32, as shown in FIG. 14. The effect of reducing the concentration of electrons contained in a 2DEG channel due to the third oxidized region 46 may be increased.

Figure 9:
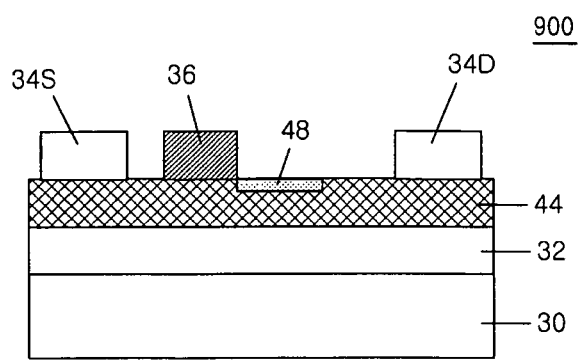
Figure 15:
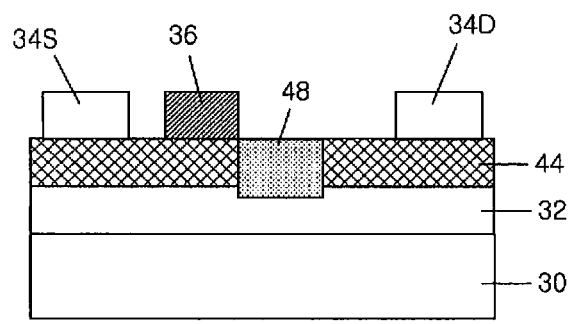

FIG. 9 is cross-sectional diagram illustrating a HEMT 900 according to example embodiments. The HEMT 900 of FIG. 9 may include a channel increasing layer 44 and a fourth oxidized region 48. Referring to FIG. 9, a channel increasing layer 44 may be on a second material layer 32 and include the fourth oxidized region 48. The fourth oxidized region 48 may be between a gate electrode 36 and a drain electrode 34D. The concentration of electrons contained in a 2DEG channel formed below the fourth oxidized region 48 may be reduced in a first material layer 30. The 2DEG channel formed below the fourth oxidized region 48 may be an LDD region. The fourth oxidized region 48 and the gate electrode 36 may contact each other. The fourth oxidized region 48 may extend into the second material layer 32 as illustrated in FIG. 15 and the effect of reducing the concentration of electrons contained in a 2DEG channel due to the fourth oxidized region 48 may be increased.

Figure 10:
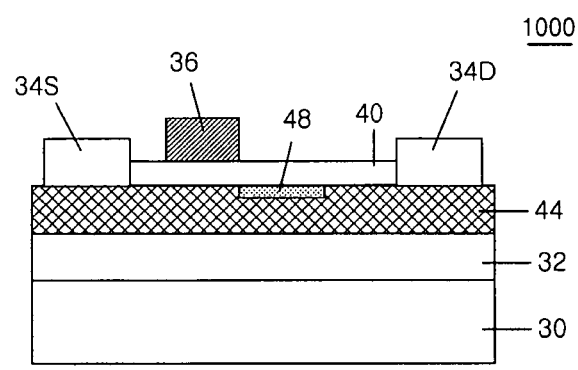
Figure 16:
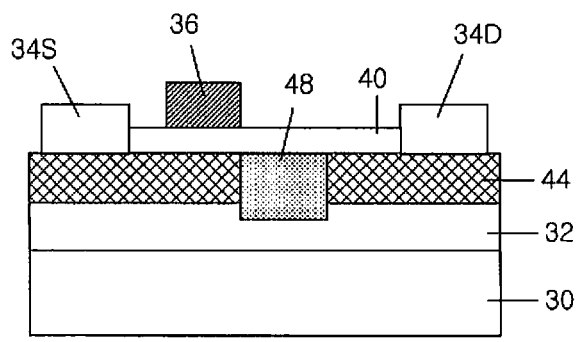

FIG. 10 is cross-sectional diagram illustrating a HEMT 1000 according to example embodiments. The HEMT 1000 of FIG. 10 similar to the HEMT 900 of FIG. 9 and may include an insulating layer 40. Referring to FIG. 10, the insulating layer 40 may be on a channel increasing layer 44 between a source electrode 34S and a drain electrode 34D. The insulating layer 40 may contact the source and drain electrodes 34S and 34D. A gate electrode 36 may be on the insulating layer 40. Because a fourth oxidized region 48 may be covered by the insulating layer 40, the fourth oxidized region 48 may not directly contact the gate electrode 36. The fourth oxidized region 48 may extend into the second material layer 32 as shown in FIG. 16 and the effect of reducing the concentration of electrons contained in a 2DEG channel may be increased.

Figure 11:
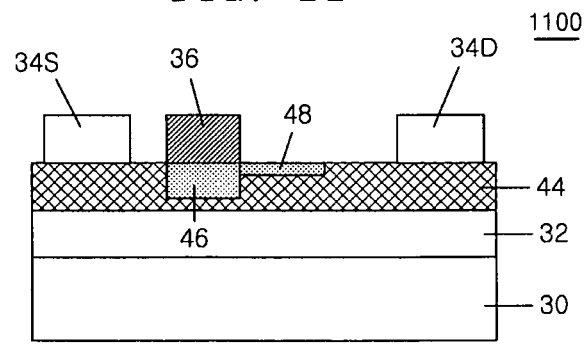
Figure 17:
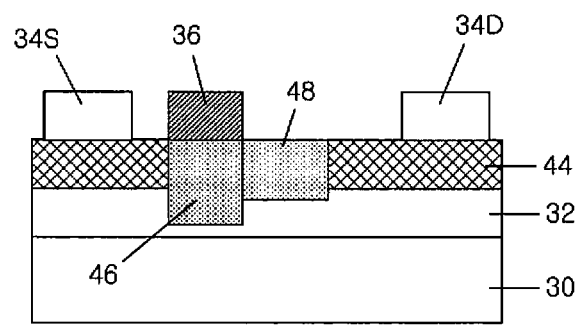

FIG. 11 is cross-sectional diagram illustrating a HEMT 1100 according to example embodiments. In FIG. 11, a channel increasing layer 44 may include both a third oxidized layer 46 and a fourth oxidized layer 48. Referring to FIG. 11, the channel increasing layer 44 may include the third and fourth oxidized regions 46 and 48 between a source electrode 34S and a drain electrode 34D. The positional relationship between the gate electrode 36 and the third and fourth oxidized regions 46 and 48 may be the same or similar to that described with respect to FIGS. 7 and 9. The third and fourth oxidized regions 46 and 48 may be in a downwards direction from a top surface of the channel increasing layer 44. The depth and concentration of oxygen of the fourth oxidized region 48 may be less than those of the third oxidized region 46. The third and fourth oxidized regions 46 and 48 may extend into the second material layer 32 as shown in FIG. 17 and the effect of reducing the concentration of electrons contained in a 2DEG channel may be increased.

Figure 12:
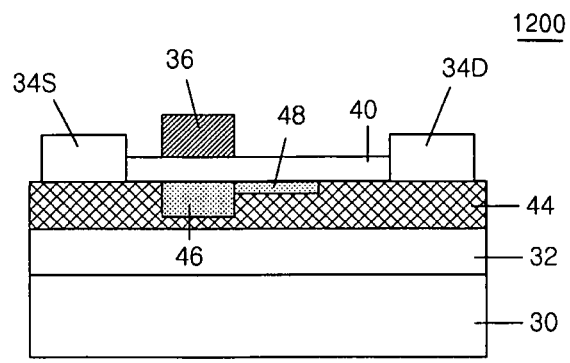
Figure 18:
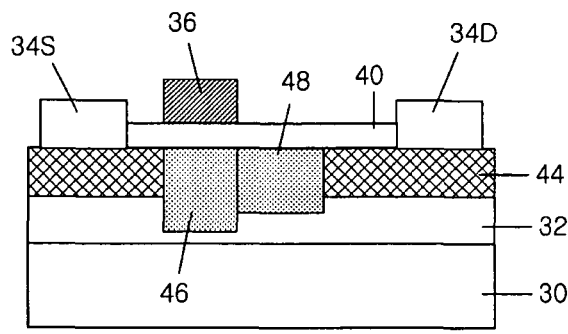

FIG. 12 is cross-sectional diagram illustrating a HEMT 1200 according to example embodiments. The HEMT 1200 of FIG. 12 may be similar to the HEMT 1100 of FIG. 11 and may include an insulating layer 40. Referring to FIG. 12, the insulating layer 40 may be on the channel increasing layer 44 between a source electrode 34S and a drain electrode 34D. Third and fourth oxidized regions 46 and 48 may be covered by the insulating layer 40. The gate electrode 36, and the third and fourth oxidized regions 46 and 48 may not contact one another. The third and fourth oxidized regions 46 and 48 may extend into the second material layer 32 as illustrated in FIG. 18 and the effect of reducing the concentration of electrons contained in a 2DEG channel may be increased.

Figure 19:
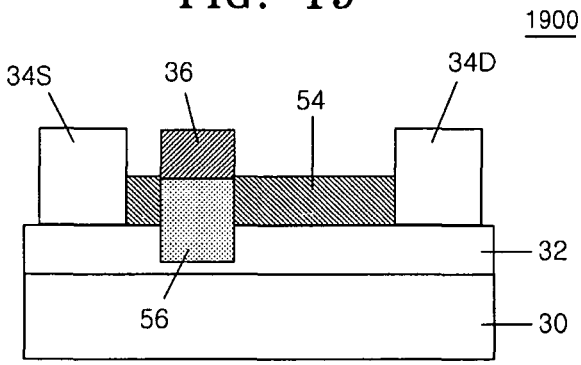

FIG. 19 is cross-sectional diagram illustrating a HEMT 1900 according to example embodiments. Referring to FIG. 19, a metal insulator semiconductor (MIS)-HEMT structure may include an insulating layer 54 on a second material layer 32 between a source electrode 34S and a drain electrode 34D. The gate electrode 36 may be on the insulating layer 54. The insulating layer 54 may increase the concentration of electrons contained in a 2DEG channel in the first material layer 30. The insulating layer 54 may be, for example, an aluminum oxide layer (e.g., an $Al_2O_3$ layer). The insulating layer 54 may include a fifth oxidized region 56. The fifth oxidized region 56 may be below a gate electrode 36 and may contact the gate electrode 36. The fifth oxidized region 56 may extend into the second material layer 32 and may be spaced apart from a bottom surface of a second material layer 32. The fifth oxidized region 56 may include an oxidized portion of the second material layer 32 and may have less polarizability than that of the remaining portion of the second material layer 32. The fifth oxidized region 56 may include oxygen ions that function as acceptors.

Figure 20:
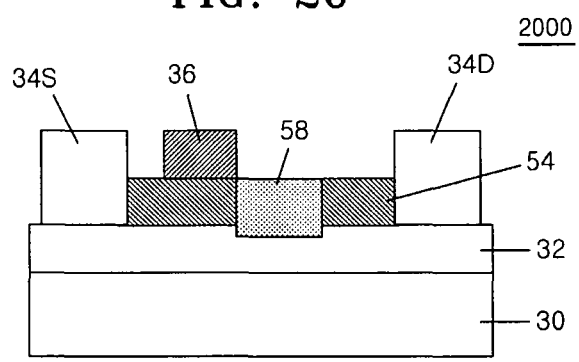

FIG. 20 is cross-sectional diagram illustrating a HEMT 2000 according to example embodiments. Referring to FIG. 20, a MIS-HEMT structure may include an insulating layer 54 on a second material layer 32 between a source electrode 34S and a drain electrode 34D. A sixth oxidized region 58 may be included in the insulating layer 54 between a gate electrode 36 and the drain electrode 34D. The gate electrode 36 may contact the sixth oxidized region 58. The sixth oxidized region 58 may extend into the second material layer 32. A length by which the sixth oxidized region 58 may extend into the second material layer 32 may be shorter than a fifth oxidized region 56. The sixth oxidized region 58 may include an oxidized portion of the second material layer 32.

Figure 21:
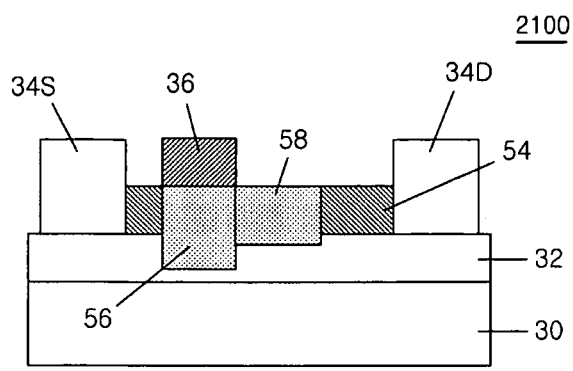

FIG. 21 is cross-sectional diagram illustrating a HEMT 2100 according to example embodiments. The HEMT 2100 of FIG. 21 may include a fifth oxidized region 56 and a sixth oxidized region 58. Referring to FIG. 21, a MIS-HEMT structure may include an insulating layer 54 between a source electrode 34S and a drain electrode 34D, the fifth oxidized region 56 and the sixth oxidized region 58. The fifth and sixth oxidized regions 56 and 58 may contact each other. An insulating layer 54 is formed between the source electrode 34S and the fifth oxidized region 56, and between the drain electrode 34D and the sixth oxidized region 58. The positional relationship between the gate electrode 36, and the fifth and sixth oxidized regions 56 and 58, may be the same or similar to that of FIGS. 19 and 20. The fifth and sixth oxidized regions 56 and 58 may extend into the second material layer 32. Degrees and lengths by which the fifth and sixth oxidized regions 56 and 58 extend into the second material layer 32 may vary, as illustrated in FIG. 21. In the HEMT of FIG. 21, an LDD region may be in a 2DEG channel below the sixth oxidized region 58 due to the sixth oxidized region 58. In an off state of a HEMT, an electric field may be prevented from being concentrated at the gate electrode 36 due to space charges.

Figure 22:
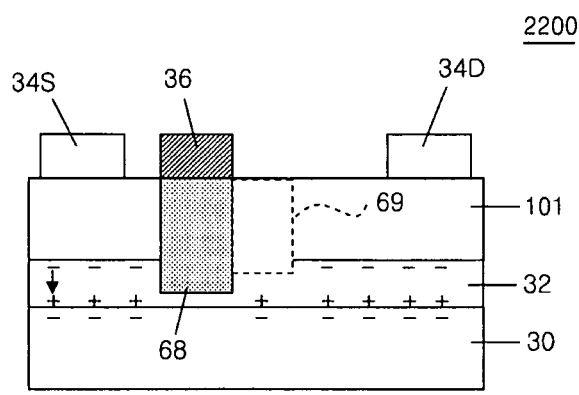

FIG. 22 is cross-sectional diagram illustrating a HEMT 2200 according to example embodiments. Referring to FIG. 22, a third material layer 101 may be on a second material layer 32. The third material layer 101 may have the same or similar properties to that of a first material layer 30. A 2-dimensional positive (+) gas (e.g., 2DHG) may be induced under a surface of the third material layer 101 which may contact the second material layer 32 due to polarization of the second material layer 32. The 2DHG formed under the surface of the third material layer 101 may not be illustrated.

A source electrode 34S, a gate electrode 36 and a drain electrode 34D may be on the third material layer 101. The third material layer 101 may include a seventh oxidized region 68. The seventh oxidized region 68 may be below the gate electrode 36. The seventh oxidized region 68 may be formed by using the same methods as those of the first through sixth oxidized regions 38, 42, 46, 48, 56 and 58. The seventh oxidized region 68 may extend into the second material layer 32. The seventh oxidized region 68 may be spaced apart from a bottom surface of the second material layer 32. An eighth oxidized region 69 may be in the third material layer 101. The eighth oxidized region 69 may extend into the second material layer 32.

An extending degree of the eighth oxidized region 69 may be less than that of the seventh oxidized region 68. The eighth oxidized region 69 may be oxidized, similarly to the seventh oxidized region 68. The eighth oxidized region 69 may reduce the concentration of electrons contained in a 2DEG channel (−). The effect of reducing the concentration of electrons due to the eighth oxidized region 69 may be smaller than due to the seventh oxidized region 68. An LDD region may be formed in an n-channel, that is a 2DEG channel (−), due to the eighth oxidized region 69. In FIG. 22, both the seventh and eighth oxidized regions 68 and 69 may be used, or alternatively, any one of the seventh and eighth oxidized regions 68 and 69 may be used.

Figure 23:
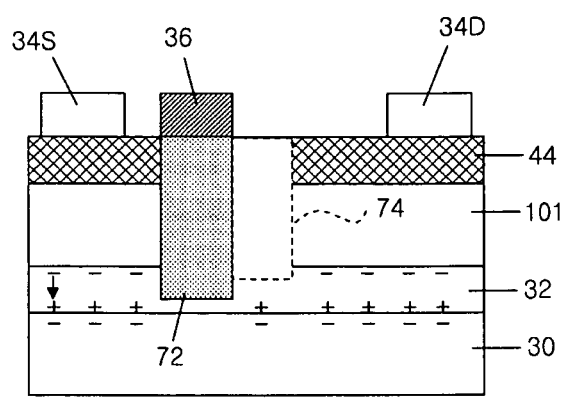

FIG. 23 is cross-sectional diagram illustrating a HEMT 2300 according to example embodiments. Referring to FIG. 23, the HEMT 2300 may be similar to the HEMT 2200 of FIG. 22 and may include a channel increasing layer 44 on a third material layer 101. A source electrode 34S, a gate electrode 36 and a drain electrode 34D may be on the channel increasing layer 44. The HEMT 2300 of FIG. 23 may include a ninth oxidized region 72 and/or a tenth oxidized region 74. The ninth oxidized region 72 may extend similarly to the seventh oxidized region 68 of FIG. 22 and into the channel increasing layer 44. The ninth oxidized region 72 may contact the gate electrode 36. The tenth oxidized region 74 may extend similarly to the eighth oxidized region 69 of FIG. 22 and into the channel increasing layer 44. The tenth oxidized region 74 may extend to a top surface of the channel increasing layer 44.

Figure 24:
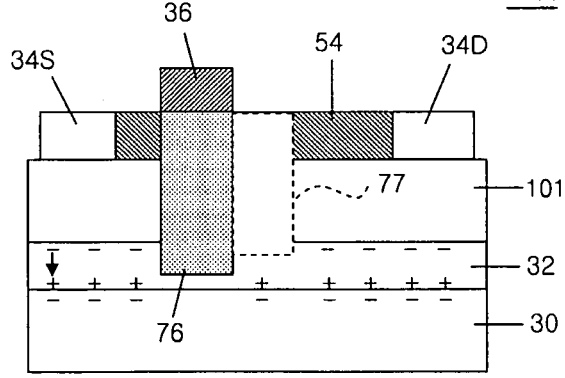

FIG. 24 is cross-sectional diagram illustrating a HEMT 2400 according to example embodiments. Referring to FIG. 24, the HEMT 2400 may be similar to the HEMT 2200 of FIG. 22 and may include an insulating layer 54 on a third material layer 101 between a source electrode 34S and a drain electrode 34D. The gate electrode 36 may be on the insulating layer 54. The HEMT 2400 of FIG. 24 may include an eleventh oxidized region 76 and/or a twelfth oxidized region 77. The eleventh oxidized region 76 may extend similarly to the seventh oxidized region 68 of FIG. 22 and into the insulating layer 54. The eleventh oxidized region 76 may contact the gate electrode 36. The twelfth oxidized region 77 may extend similarly the eighth oxidized region 69 of FIG. 22 and extend into the insulating layer 54. The twelfth oxidized region 77 may extend to a top surface of the insulating layer 54. The eleventh oxidized region 76 may perform the same or similar function to that of other oxidized regions below the gate electrode 36 according to example embodiments. The concentration of electrons contained in a 2DEG channel (−) of the first material layer 30 may be reduced by the twelfth oxidized region 77 and an LDD region may be in a 2DEG channel below the twelfth oxidized region 77.

Figure 25:
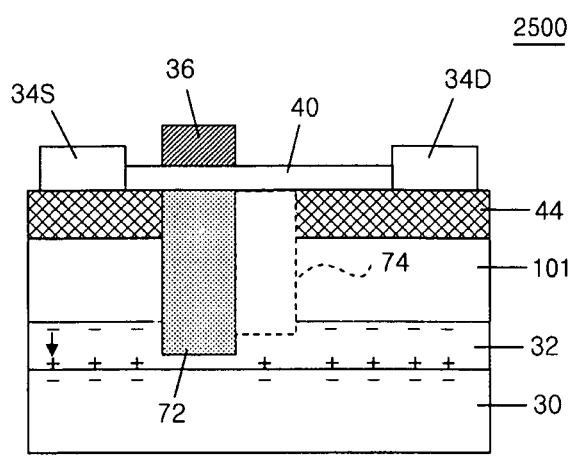

FIG. 25 is cross-sectional diagram illustrating a HEMT 2500 according to example embodiments. Referring to FIG. 25, the HEMT 2500 of FIG. 25 may be similar to the HEMT 2300 of FIG. 23 and may include an insulating layer 40 on a channel increasing layer 44 between a source electrode 34S and a drain electrode 34D. The insulating layer 40 may contact the source electrode 34S and the drain electrode 34D.

According to example embodiments, in the HEMT 2200 of FIG. 22, the first material layer 30 and the second material layer 32 may be reversed. For example, the first material layer 30 may be a semiconductor layer having large polarizability and a wide band gap (e.g., an AlGaN layer or an AlN layer). The second material layer 32 may be a semiconductor layer having small polarizability and a narrow band gap compared to the first material layer 30 (e.g., a GaN layer or an InGaN layer). The third material layer 101 may be a semiconductor layer having large polarizability and a wide band gap (e.g., an AlGaN layer or an AlN layer).

Figure 26:
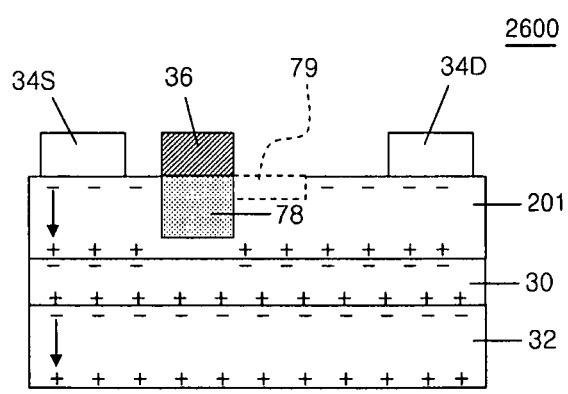

FIG. 26 is cross-sectional diagram illustrating a HEMT 2600 according to example embodiments. FIG. 26 may be a cross-sectional diagram illustrating first and second material layers 30 and 32 positionally reversed as compared to the HEMT 2200 of FIG. 22. Referring to FIG. 26, the HEMT 2600 may include the second material layer 32, the first material layer 30 and a fourth material layer 201 (e.g., sequentially stacked). The fourth material layer 201 may be of the same material as that of the second material layer 32. Arrows of the second and fourth material layers 32 and 201 indicate polarization directions. Due to the polarization of the second material layer 32, a 2DHG channel (+) may be under a surface of the first material layer 30 which may contact the second material layer 32. Due to the polarization of the fourth material layer 201, a 2DEG channel (−) may be under a surface of the first material layer 30 which may contact the fourth material layer 201.

A source electrode 34S, a gate electrode 36 and a drain electrode 34D may be spaced apart from one another on the fourth material layer 201. The fourth material layer 201 may include a thirteenth oxidized region 78. The thirteenth oxidized region 78 may be an oxide or may include oxygen ions that function as acceptors. The thirteenth oxidized region 78 may extend from a top surface of the fourth material layer 201 towards a bottom surface of the fourth material layer 201, and may be spaced apart from the bottom surface of the fourth material layer 201. Due to the thirteenth oxidized region 78, the concentration of electrons contained in a 2DEG channel (−), an n-channel of the first material layer 30, may be reduced below the thirteenth oxidized region 78.

The fourth material layer 201 may include a fourteenth oxidized region 79. The fourteenth oxidized region 79 may extend in a downwards direction from a top surface of the fourth material layer 201 similarly to the thirteenth oxidized region 78. At a top surface of a fourth material layer 201, the depth and concentration of oxygen of the fourteenth oxidized region 79 may be less than that of the thirteenth oxidized region 78. Both the thirteenth and fourteenth oxidized regions 78 and 79 may be included in the HEMT 2600, or any one of the thirteenth and fourteenth oxidized region 78 and 79 may be included. The concentration of electrons contained in a 2DEG channel (−) of the first material layer 30 may be lower below the fourteenth oxidized region 79 due to the fourteenth oxidized region 79. An LDD region may be below the fourteenth oxidized region 79.

Figure 27:
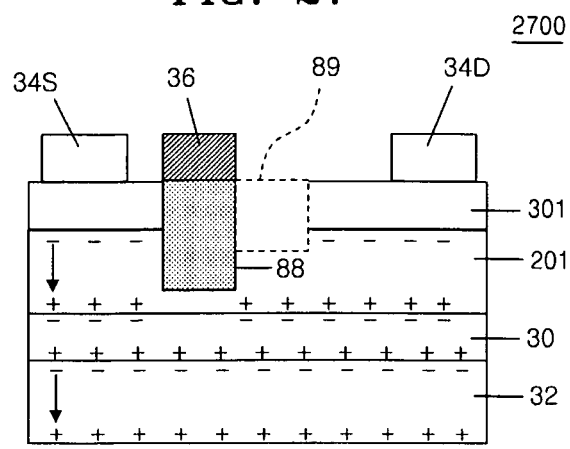

FIG. 27 is cross-sectional diagram illustrating a HEMT 2700 according to example embodiments. Referring to FIG. 27, a fifth material layer 301 may be on a fourth material layer 201. A source electrode 34S, a gate electrode 36 and a drain electrode 34D may be on the fifth material layer 301. The fifth material layer 301 may be of the same material as that of the first material layer 30. A fifteenth oxidized region 88 may be in the fifth material layer 301. The fifteenth oxidized region 88 may be below the gate electrode 36. The fifteenth oxidized region 88 may be an oxide or may include oxygen ions that function as acceptors. The fifteenth oxidized region 88 may extend into the fourth material layer 201. The fifteenth oxidized region 88 may be extend towards a bottom surface of the fourth material layer 201 and may be spaced apart from the bottom surface of the fourth material layer 201.

Because the fifteenth oxidized region 88 may reduce polarization, and/or may function as an acceptor, the concentration of electrons contained in a 2DEG channel (−) of the first material layer 30 below the fifteenth oxidized region 88 may be reduced. An LDD region may be below the fifteenth oxidized region 88 and a breakdown voltage of the HEMT 2700 may increase. The fifth material layer 301 may include a sixteenth oxidized region 89 (indicated by dotted lines). The sixteenth oxidized region 89 may extend into the fourth material layer 201. A length by which the sixteenth oxidized region 89 extends into the fourth material layer 201 may be less than that of the fifteenth oxidized region 88.

The fifteenth and sixteenth oxidized regions 88 and 89 may be in the form of a step in the fourth material layer 201. The concentration of electrons in a 2DEG channel (−) of the first material layer 30 may reduced below the sixteenth oxidized region 89 and an LDD region may be below the sixteenth oxidized region 89. Both of the fifteenth and sixteenth oxidized regions 88 and 89 may be included, or any one of the fifteenth and sixteenth oxidized regions 88 and 89 may be included.

Figure 28:
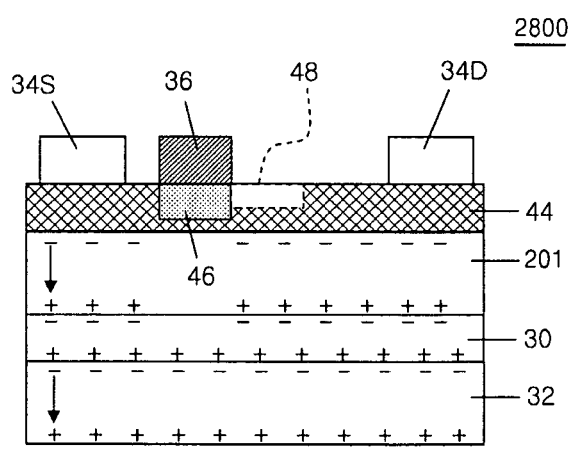
Figure 29:
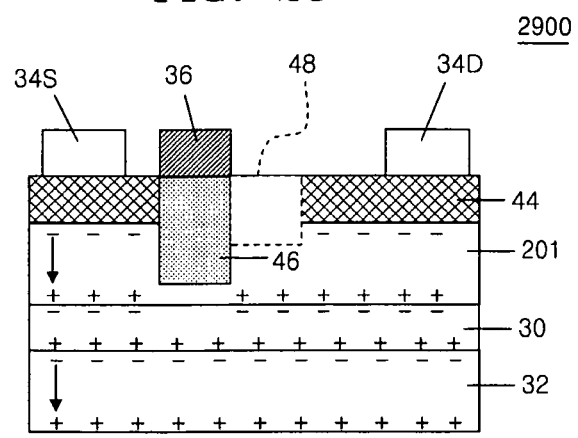

FIG. 28 is cross-sectional diagram illustrating a HEMT 2800 according to example embodiments. Referring to FIG. 28, the HEMT 2800 of FIG. 28 may be similar to the HEMT 2600 of FIG. 26 and may include a channel increasing layer 44 on a fourth material layer 201. The channel increasing layer 44 may include a third oxidized region 46 and/or a fourth oxidized region 48. The positional relationship between a source electrode 34S, a gate electrode 36 and a drain electrode 34D may be the same or similar to that of FIG. 7. The third oxidized region 46 and/or the fourth oxidized region 48 of FIG. 28 may extend into the fourth material layer 201 as illustrated in FIG. 29.

Figure 30:
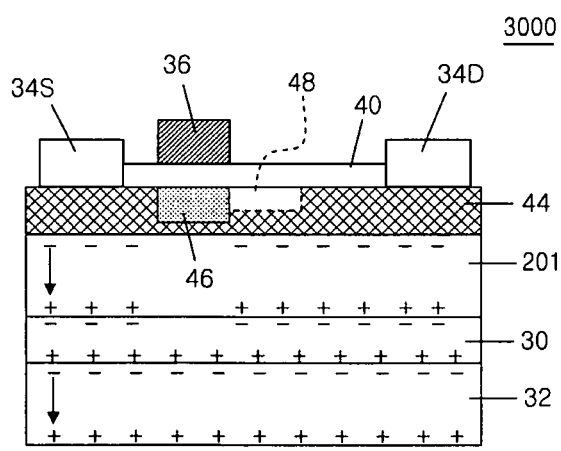

FIG. 30 is cross-sectional diagram illustrating a HEMT 3000 according to example embodiments. Referring to FIG. 30, the HEMT 3000 of FIG. 30 may be similar to the HEMT 2800 of FIG. 28 and may include an insulating layer 40 on a channel increasing layer 44 between a source electrode 34S and a drain electrode 34D. The positional relationship between the source electrode 34S, a gate electrode 36 and the drain electrode 34D may be the same or similar to that of FIG. 8.

Figure 31:
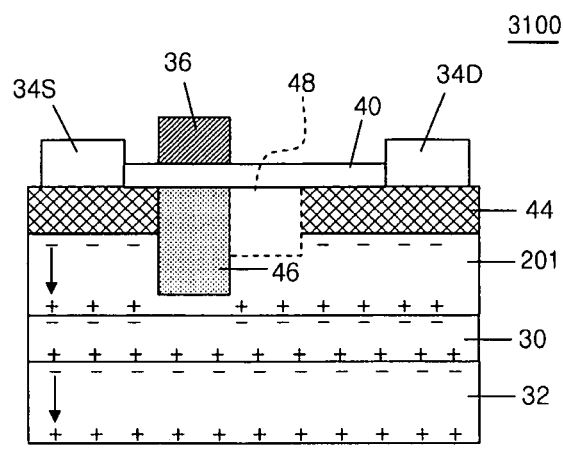

FIG. 31 is cross-sectional diagram illustrating a HEMT 3100 according to example embodiments. Referring to FIG. 31, the HEMT 3100 of FIG. 31 may be similar to the HEMT 2900 of FIG. 29 and may include an insulating layer 40 on a channel increasing layer 44 between a source electrode 34S and a drain electrode 34D. The positional relationship between the source electrode 34S, a gate electrode 36 and the drain electrode 34D may be the same or similar to that of FIG. 14.

Figure 32:
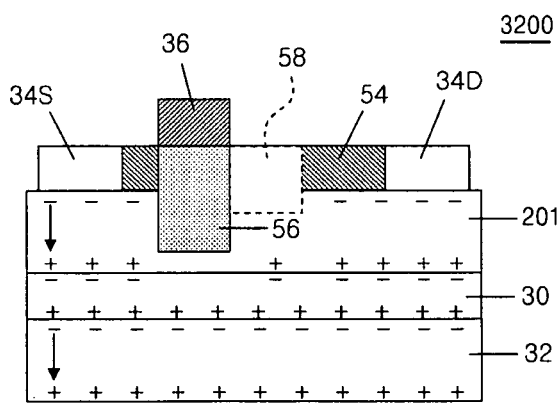

FIG. 32 is cross-sectional diagram illustrating a HEMT 3200 according to example embodiments. Referring to FIG. 32, the HEMT 3200 of FIG. 32 may be similar to the HEMT of FIG. 26 and may include an insulating layer 54 on a fourth material layer 201 between a source electrode 34S and a drain electrode 34D. A fifth oxidized region 56 and/or a sixth oxidized region 58 may be in the insulating layer 54. The positional relationship between the source electrode 34S, a gate electrode 36 and the drain electrode 34D may be the same or similar to that of FIG. 21.

Figure 33:
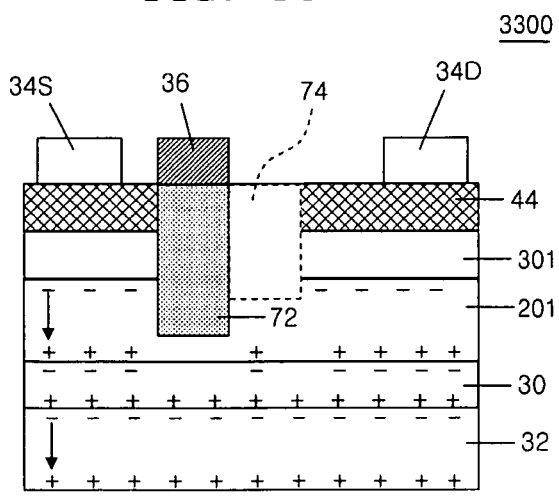

FIG. 33 is cross-sectional diagram illustrating a HEMT 3300 according to example embodiments. Referring to FIG. 33, the HEMT 3300 of FIG. 33 may be similar to the HEMT 2700 of FIG. 27 and may include a channel increasing layer 44 on a fifth material layer 301. The positional relationship between a source electrode 34S, a gate electrode 36 and a drain electrode 34D may be the same or similar to that of FIG. 28. The HEMT 3300 of FIG. 33 may include a ninth oxidized region 72 and/or a tenth oxidized region 74. The ninth and tenth oxidized regions 72 and 74 are described with reference to FIG. 23.

Figure 34:
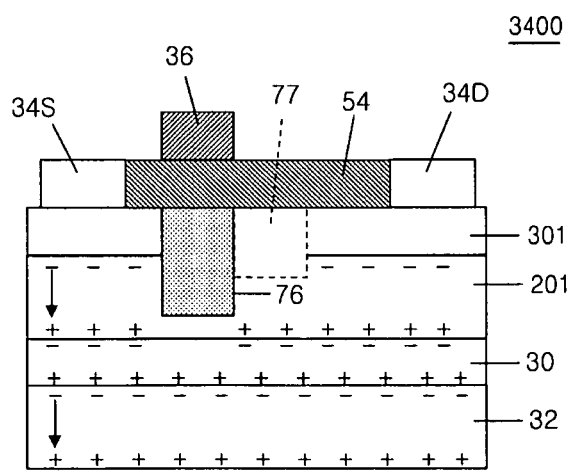

FIG. 34 is cross-sectional diagram illustrating a HEMT 3400 according to example embodiments. Referring to FIG. 34, the HEMT 3400 of FIG. 34 may be similar to the HEMT 2700 of FIG. 27 and may include an insulating layer 54 on a fifth material layer 301. The positional relationship between a source electrode 34S, a gate electrode 36 and a drain electrode 34D may be the same or similar to that of FIG. 24. The HEMT 3400 may include an eleventh oxidized region 76 and/or a twelfth oxidized region 77. The eleventh and twelfth oxidized regions 76 and 77 are described with reference to FIG. 24.

Figure 35:
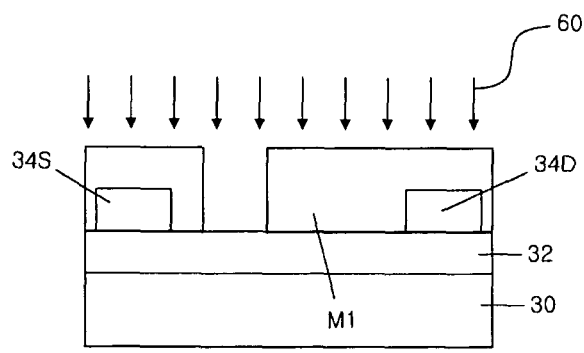
FIGS. 35-38 are cross-sectional diagrams illustrating methods of manufacturing the HEMT of FIG. 1 according to example embodiments.
Figure 36:
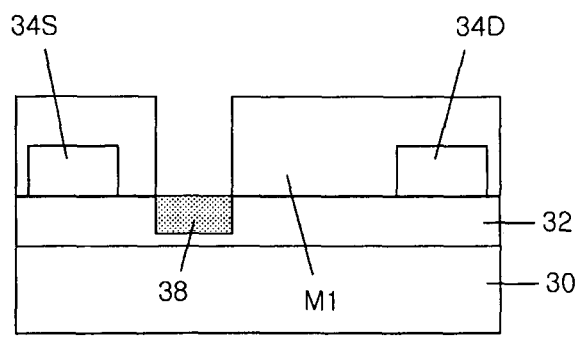

FIGS. 35-38 are cross-sectional diagrams illustrating methods of manufacturing the HEMT 100 of FIG. 1 according to example embodiments. Referring to FIG. 35, a substrate (not shown) and a buffer layer (not shown) may be sequentially formed. The first material layer 30 and the second material layer 32 may be sequentially formed on the buffer layer. The source electrode 34S and the drain electrode 34D may be formed on the second material layer 32 so as to be spaced apart from each other. A mask M1 for covering the source electrode 34S and the drain electrode 34D, and for exposing a portion of the second material layer 32 between the source electrode 34S and the drain electrode 34D, may be formed on the second material layer 32. An oxygen treatment 60 may be performed on the exposed portion of the second material layer 32. The oxygen treatment 60 may be performed for about 10 to about 600 seconds, for example. The exposed portion of the second material layer 32 may be oxidized by the oxygen treatment 60. The oxygen treatment 60 may be performed by using any one of $O_2$ plasma, $O_2$ annealing, $O_3$, ultraviolet (UV) oxidation, O radicals and O implant. Referring to FIG. 36, the first oxidized region 38 may be formed in the second material layer 32 between the source electrode 34S and the drain electrode 34D.

Figure 37:
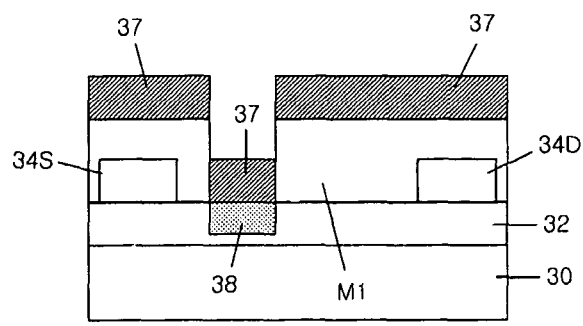
Figure 38:
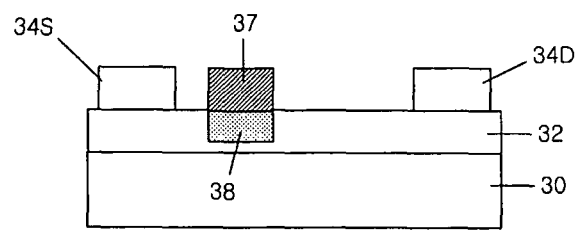

Referring to FIG. 37, a gate material layer 37 may be formed on a top surface of the first oxidized region 38. The gate material layer 37 may also be formed on the mask M1. The gate material layer 37 may be a material for forming the gate electrode 36. The mask M1 may be removed by using a lift off method. The gate material layer 37 on the mask M1 may also be removed. Referring to FIG. 38, the gate material layer 37 remaining on the first oxidized region 38 of the second material layer 32 may be the gate electrode 36.

Figure 39:
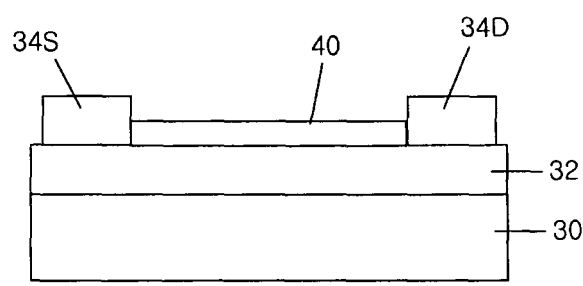
FIGS. 39-43 are cross-sectional diagrams illustrating methods of manufacturing the HEMT of FIG. 2 according to example embodiments.

FIGS. 39-43 are cross-sectional diagrams illustrating methods of manufacturing the HEMT of FIG. 2 according to example embodiments. Referring to FIG. 39, the source electrode 34S and the drain electrode 34D may be formed on the second material layer 32 so as to be spaced apart from each other, and the insulating layer 40 may be formed on the second material layer 32 between the source electrode 34S and the drain electrode 34D. The insulating layer 40 may be formed by using an in-situ process. The insulating layer 40 may be formed so as to contact the source electrode 34S and the drain electrode 34D.

Figure 40:
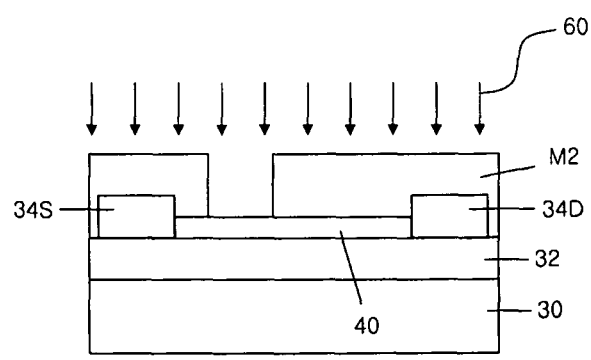

Referring to FIG. 40, the source electrode 34S, the drain electrode 34D and the insulating layer 40 may be covered by a mask M2. A portion of the mask M2, corresponding to the first oxidized region 38 under the insulating layer 40 may be removed to expose a portion of the insulating layer 40. After the mask M2 is formed, the oxygen treatment 60 is performed on the second material layer 32 formed below the insulating layer 40 through the exposed portion of the insulating layer 40. The oxygen treatment 60 may be performed at a higher power than where the insulating layer 40 is not used. A depth of the first oxidized region 38 formed in the second material layer 32 and the concentration of oxygen contained in the first oxidized region 38 may be controlled by adjusting the power used in the oxygen treatment 60. The depth of the first oxidized region 38 may be measured from a top surface of the second material layer 32.

Figure 41:
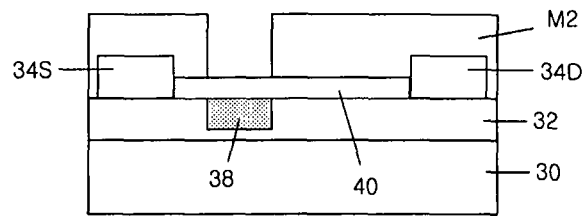
Figure 42:
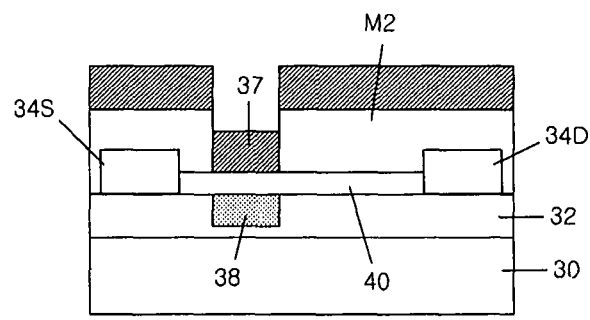
Figure 43:
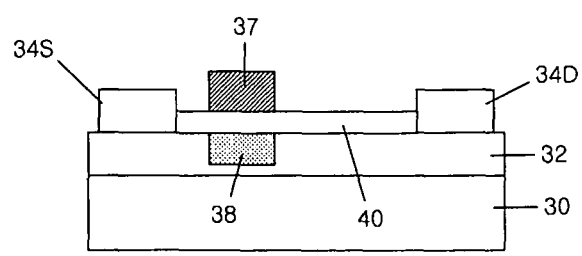

Referring to FIG. 41, the first oxidized region 38 may be formed in a portion of the second material layer 32 corresponding to the exposed portion of the insulating layer 40. Referring to FIG. 42, the gate material layer 37 may be formed so as to cover the exposed portion of the insulating layer 40. The gate material layer 37 may also be formed on the mask M2. When the mask M2 is removed, the gate material layer 37 formed on the mask M2 may also be removed. Referring to FIG. 43, the gate material layer 37 may remain on a portion corresponding to the first oxidized region 38 of the insulating layer 40. The gate material layer 37 may be the gate electrode 36 of FIG. 2. A location of the gate material layer 37 formed on the insulating layer 40 may be determined by the mask M2 used in the oxygen treatment 60. The location of the gate material layer 37 which is used as the gate electrode 36 may be self-aligned by the mask M2. A separate mask for forming the gate material layer 37 may not be required and the number of processes may be reduced.

Figure 44:
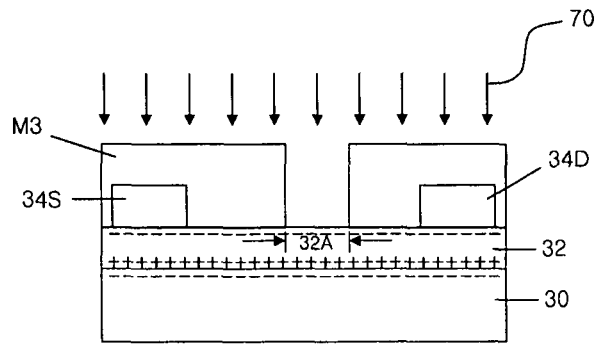
FIGS. 44 and 45 are cross-sectional diagrams illustrating methods of manufacturing the HEMT of FIG. 3 according to example embodiments.
Figure 45:
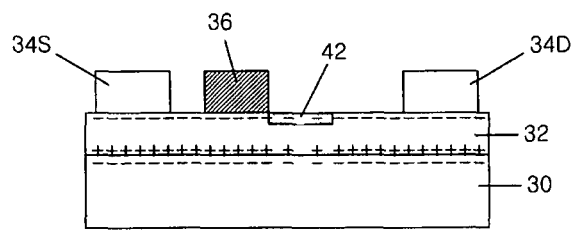

FIGS. 44 and 45 are cross-sectional diagrams illustrating methods of manufacturing the HEMT of FIG. 3 according to example embodiments. Referring to FIG. 44, a mask M3 may be formed on the second material layer 32, and to cover the source electrode 34S and the drain electrode 34D. The mask M3 may expose a first region 32A of the second material layer 32 between the source electrode 34S and the drain electrode 34D. The mask M3 may be a photosensitive pattern. The second oxidized region 42 of FIG. 3 may be formed in the first region 32A. An oxygen treatment 70 may be performed on the first region 32A. The oxygen treatment 70 may be the same or similar to the oxygen treatment 60 of FIG. 35. The oxygen treatment 70 of FIG. 44 may be performed at a lower power than in a case of the oxygen treatment 60 of FIG. 35.

Referring to FIG. 45, as a result of the oxygen treatment 70 the second oxidized region 42 may be formed in the second material layer 32. The gate electrode 36 may be formed on the second material layer 32 between the source electrode 34S and the second oxidized region 42. The gate electrode 36 may be formed so as to be spaced apart from the source electrode 34S and to contact the second oxidized region 42.

During the formation of the second oxidized region 42, polarization of a portion of the second material layer 32 in which the second oxidized region 42 is formed may be decreased as compared to the remaining portion of the second material layer 32. In FIG. 45, an amount of polarized charge of the second oxidized region 42 is less than that of the remaining portion of the second material layer 32, which may indicate that polarization of the second oxidized region 42 is decreased compared to the remaining portion of the second material layer 32.

Although not shown, in order to form the HEMT of FIG. 4, after the second oxidized region 42 is formed, before the gate electrode 36 is formed, as shown in FIG. 4, the insulating layer 40 covering the second oxidized region 42 may be formed on the second material layer 32 between the source electrode 34S and the drain electrode 34D, and then the gate electrode 36 may be formed on the insulating layer 40.

Figure 46:
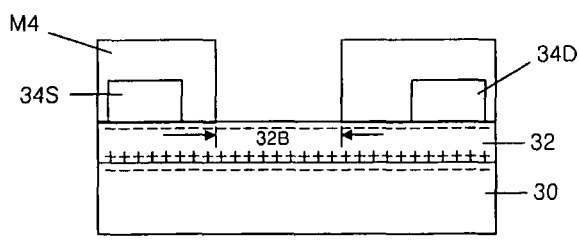
FIGS. 46-52 are cross-sectional diagrams illustrating methods of manufacturing the HEMTs of FIGS. 5 and 6 according to example embodiments.

FIGS. 46-52 are cross-sectional diagrams illustrating methods of manufacturing the HEMTs of FIGS. 5 and 6 according to example embodiments. Referring to FIG. 46, the source electrode 34S and the drain electrode 34D may be formed on the second material layer 32 so as to be spaced apart from each other. A mask M4 may be formed on the second material layer 32, the mask M4 covering the source electrode 34S and the drain electrode 34D. The mask M4 may expose a second region 32B of the second material layer 32 between the source electrode 34S and the drain electrode 34D. The first and second oxidized regions 38 and 42 may be formed in the second region 32B.

Figure 47:
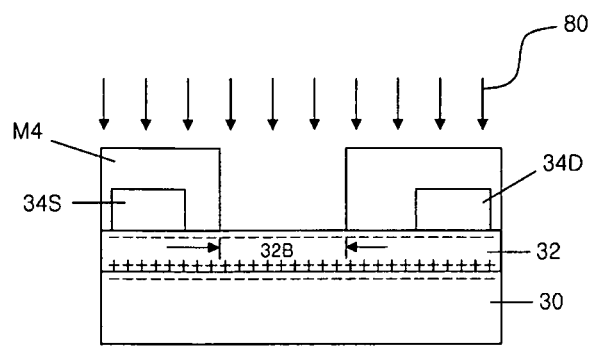
Figure 48:
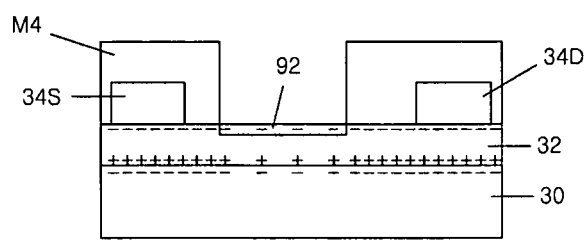

Referring to FIG. 47, an oxygen treatment 80 may be performed on the second region 32B. The oxygen treatment 80 may be the same or similar to that of the oxygen treatment 60 of FIG. 35. Referring to FIG. 48, by performing the oxygen treatment 80, a seventeenth oxidized region 92 may be formed in the second region 32B of the second material layer 32. The mask M4 may be removed. The seventeenth oxidized region 92 may be formed to the depth of the second oxidized region 42 of FIG. 5. The polarizability of the seventeenth oxidized region 92 may be less than that of the second material layer 32. As illustrated in FIG. 48, the amounts of polarized charges of the seventeenth oxidized region 92 and the remaining portion of the second material layer 32 may be being different.

Figure 49:
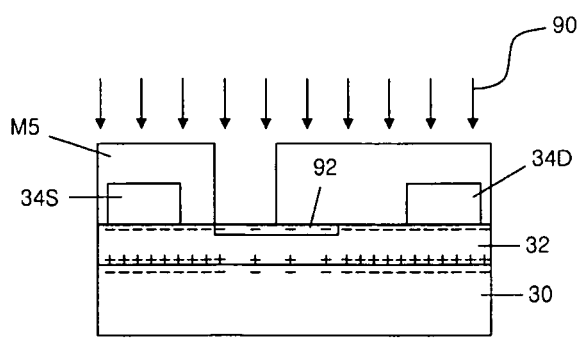

Referring to FIG. 49, a mask M5 may be formed on the second material layer 32, the mask M5 covering the source electrode 34S and the drain electrode 34D, and covering a portion of the seventeenth oxidized region 92. The portion of the seventeenth oxidized region 92 covered by the mask M5 may correspond to the second oxidized region 42 of FIG. 5. The mask M5 may expose a portion of the seventeenth oxidized region 92, the portion corresponding to the first oxidized region 38 of FIG. 5. An oxygen treatment 90 may be performed on the exposed portion of the seventeenth oxidized region 92. The oxygen treatment 90 may be performed at a higher power than, for example, the oxygen treatment 80 of FIG. 47.

Figure 50:
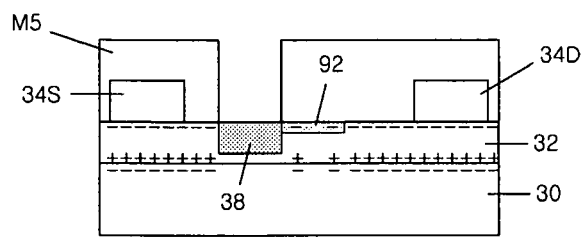

Referring to FIG. 50, the first oxidized region 38 that may extend to a greater depth than that of the seventeenth oxidized region 92 may be formed in the exposed portion of the seventeenth oxidized region 92. Due to the formation of the first oxidized region 38, polarization of the first oxidized region 38 may be decreased and the concentration of electrons contained in a 2DEG channel (−) of the first material layer 30 below the first oxidized region 38 may be reduced. The oxygen treatment 90 may be the same or similar to that of the oxygen treatment 60 of FIG. 35, and may use the same or similar power to that of the oxygen treatment 60 of FIG. 35. By performing the oxygen treatments 80 and 90 of FIGS. 47 and 49, a stepped oxidized region 38+92 may be formed in the second material layer 32. A portion of the seventeenth oxidized region 92, covered by the mask M5, may function as an LDD region.

Figure 51:
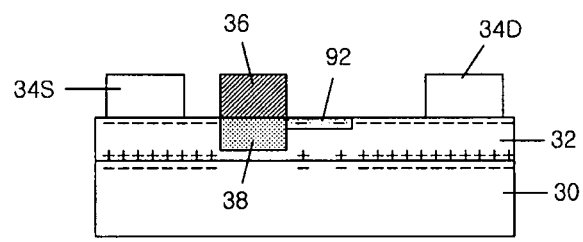
Figure 52:
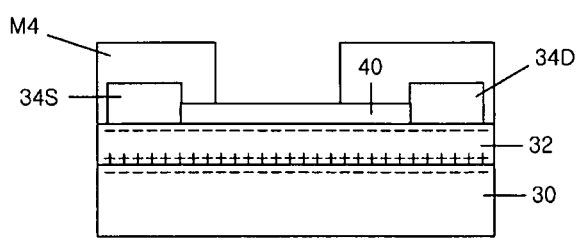

Referring to FIG. 51, the gate electrode 36 may be formed on the first oxidized region 38. The gate electrode 36 may be formed by using a same or similar method to that of the method for forming the gate material layer 37 of FIG. 38. Referring to FIG. 52, the insulating layer 40 may be formed on the second material layer 32 between the source electrode 34S and the drain electrode 34D, prior to the forming of the mask M4 of FIG. 46. The subsequent operations may proceed according to FIGS. 47-51, thereby manufacturing the HEMT of FIG. 6.

The HEMTs of FIGS. 7-21 may be manufactured by using the same or similar methods to the methods described with reference to FIGS. 35-51 except that the channel increasing layer 44 or the insulating layer 54 may be formed on the second material layer 32, the channel increasing layer 44 and/or the second material layer 32 may be oxidized, and the insulating layer 54 and/or the second material layer 32 may be oxidized. Detailed descriptions of the methods of manufacturing the HEMTs of FIGS. 7-21 are omitted.

The HEMTs of FIGS. 22-25 may be manufactured in the same or similar manner to the methods described with reference to FIGS. 35-51 except that the third material layer 101 and the insulating layer 54 may be sequentially formed on the second material layer 32, or the third material layer 101, the channel increasing layer 44 and the insulating layer 40 may be sequentially formed on the second material layer 32, and the channel increasing layer 44 and the insulating layer 54 may be oxidized together. Detailed descriptions of the methods of manufacturing the HEMTs of FIGS. 22-25 are omitted.

The HEMTs of FIGS. 26 and 28-32 may be manufactured in the same or similar manner to the methods described with reference to FIGS. 22-25 except that the first material layer 30 and the second material layer 32 may be reversed, and the third material layer 101 and the second material layer 32 may be formed of the same material. Detailed descriptions of the methods of manufacturing the HEMTs of FIGS. 26 and 28-32 are omitted. The HEMTs of FIGS. 27, 33 and 34 may be manufactured in the same or similar manner as the method described with reference to FIGS. 26, 29 and 32 except that the fifth material layer 301 may be further formed on the fourth material layer 201. Detailed descriptions of the methods of manufacturing the HEMTs of FIGS. 27, 33 and 34 are omitted.

Figure 53:
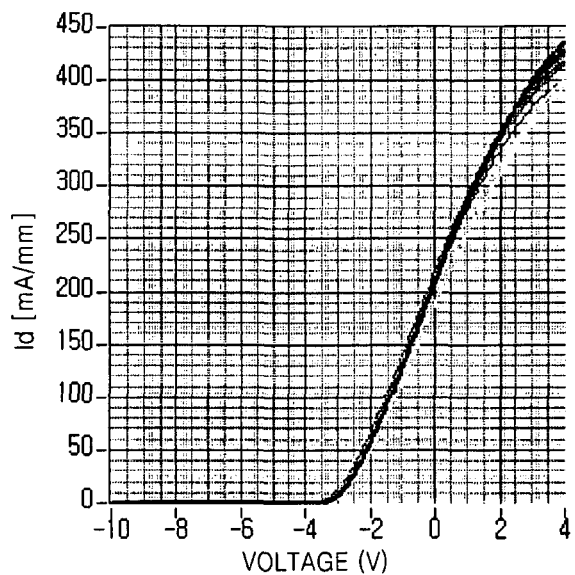
FIGS. 53-56 are graphs showing simulation results of performing oxygen treatment on a HEMT that does not include an insulating layer and a channel increasing layer according to example embodiments.
Figure 54:
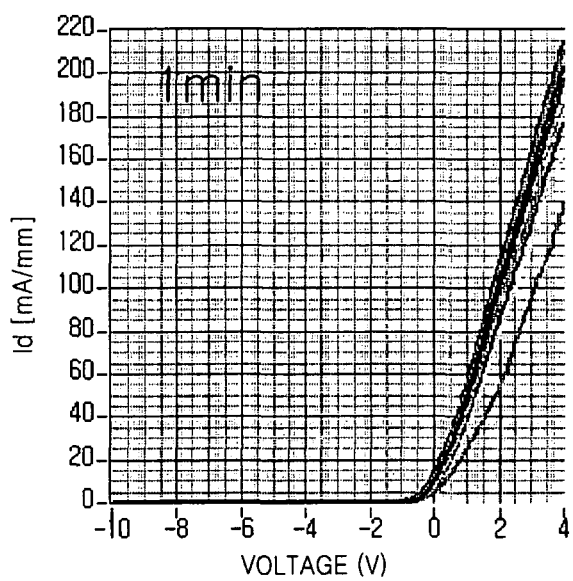
Figure 55:
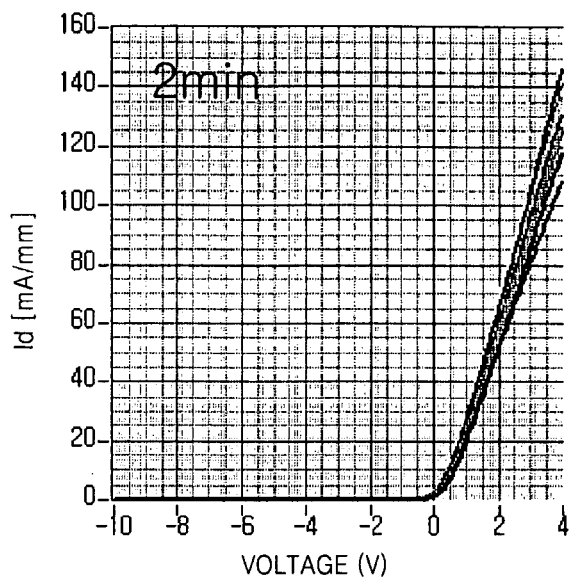
Figure 56:
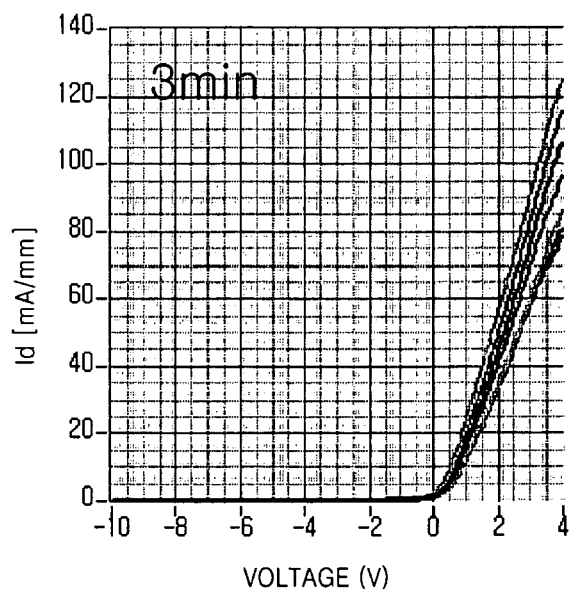

FIGS. 53-56 are graphs showing simulation results of performing oxygen treatment on a HEMT that does not include an insulating layer and a channel increasing layer according to example embodiments. Referring to FIGS. 53-56, the horizontal axis is an applied voltage and the vertical axis is a drain current (Id) based on the applied voltage. The oxygen-treatments are performed by using O2 plasma. FIG. 53 shows a result where oxygen treatment is not performed. FIGS. 54-56 show results of cases where oxygen treatment is performed for one minute, two minutes and three minutes, respectively. Comparing FIGS. 53-56, as a period of time for performing oxygen treatment is increased a threshold voltage may be increased. This result indicates that as the period of time for performing oxygen treatment is increased a breakdown voltage of a HEMT may be increased, the polarizability of the second material layer 32 may be reduced and oxygen may function as an acceptor in an oxidized region of the second material layer 32.

Figure 57:
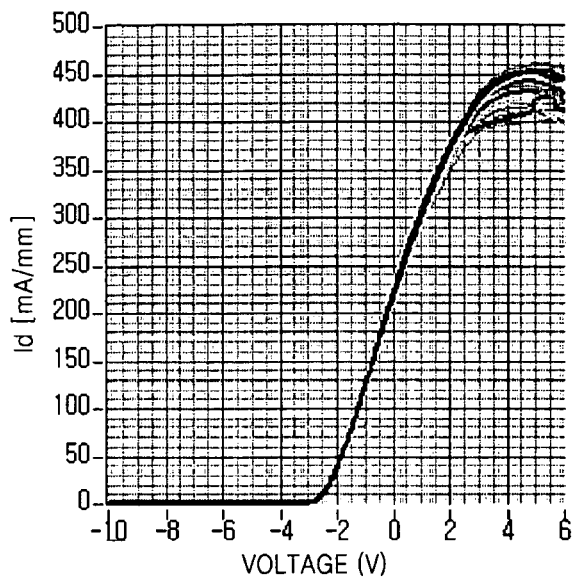
FIGS. 57 and 58 are graphs showing simulation results of performing oxygen treatment on a MIS-HEMT that includes an insulating layer according to example embodiments.
Figure 58:
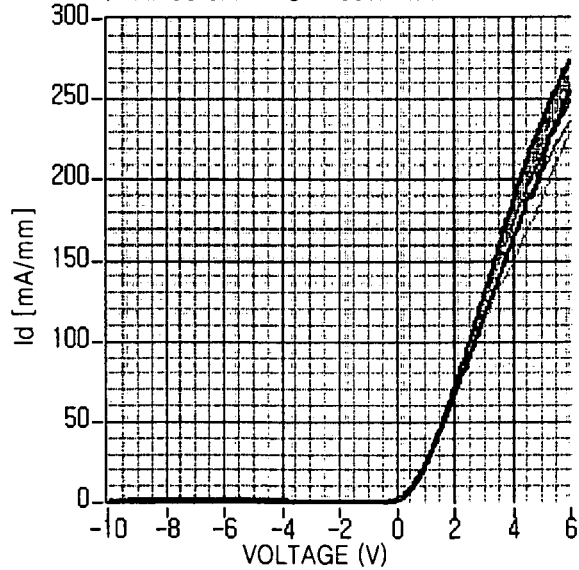

FIGS. 57 and 58 are graphs showing simulation results of performing oxygen treatment on a MIS-HEMT that includes the insulating layer 40 or 54 according to example embodiments. An $Al_2O_3$ layer is used as the insulating layer 40 or 54. The oxygen treatment uses an $O_2$ plasma method. In FIGS. 57 and 58, the horizontal axis is an applied voltage and the vertical axis is a drain current (Id) based on the applied voltage.

FIG. 57 shows a result of a case where an $Al_2O_3$ layer having a thickness of 3 nm is used as the insulating layer 40 or 54, and oxygen treatment is not performed. FIG. 58 shows a result of a case where an $Al_2O_3$ layer having a thickness of 3 nm is used as the insulating layer 40 or 54, and oxygen treatment is performed on the $Al_2O_3$ layer for about two minutes by using an $O_2$ plasma method at a power of 200 W. Referring to FIGS. 57 and 58, when the $Al_2O_3$ layer is formed and oxygen treatment is performed on the $Al_2O_3$ layer, a threshold voltage of a HEMT may increase. This result may indicate that when the insulating layer 40 or 54 is formed and oxygen treatment is performed on the insulating layer 40 or 54, a breakdown voltage of a HEMT may increase.

Figure 59:
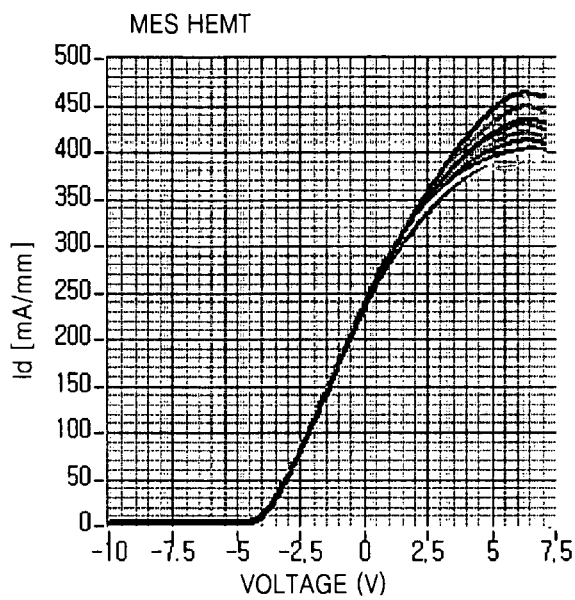
Figure 60:
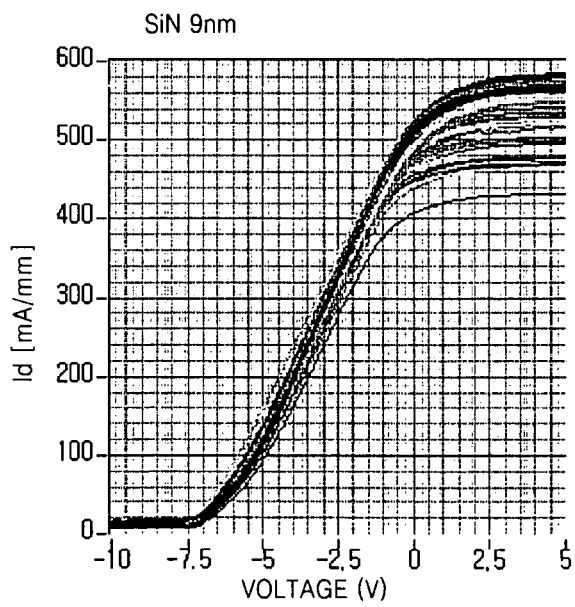
Figure 61:
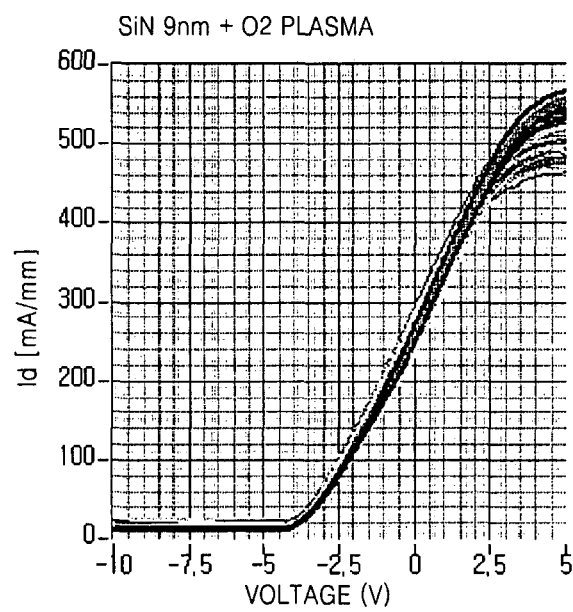

FIGS. 59-61 are graphs showing simulation results of performing oxygen treatment on a HEMT including a channel increasing layer according to example embodiments. A SiN layer is used as the channel increasing layer 44. The oxygen treatment is performed by using an O2 plasma method. In FIGS. 59-61, the horizontal axis is an applied voltage and the vertical axis is a drain current (Id) based on the applied voltage. FIG. 59 shows a result of a case where a HEMT does not include the channel increasing layer 44. FIG. 60 shows a result of a case where a SiN layer having a thickness of 9 nm is used as the channel increasing layer 44 and oxygen treatment is not performed. FIG. 61 shows a result of a case where a SiN layer having a thickness of 9 nm is used as the channel increasing layer 44 and oxygen treatment is performed on the channel increasing layer 44 for three minutes.

Comparing FIGS. 59-61, a channel increasing layer 44 may increase an on-current of a HEMT (e.g., a threshold voltage may decrease). After oxygen treatment is performed on the channel increasing layer 44, the threshold voltage may be recovered to that of where the channel increasing layer 44 is not formed. As a result, when oxygen treatment is performed, a function of the channel increasing layer 44 may be suppressed.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
 a channel layer;
 a channel supplying layer configured to induce a 2-dimensional electron gas (2DEG) channel in the channel layer;
 a source electrode, a gate electrode and a drain electrode on the channel layer and the channel supplying layer; and
 an oxygenated region including a part of at least the channel supplying layer, the oxygenated region including an oxidized product of at least a material of the channel supplying layer, the oxygenated region adjacent to the gate electrode,
 the oxygenated region including a first oxygenated region and a second oxygenated region,
  the first oxygenated region being between the gate electrode and the channel layer, and
  the second oxygenated region being between the drain electrode and the gate electrode,
 wherein the second oxygenated region is not in contact with the drain electrode.

2. The HEMT of claim 1, wherein at least one of the first oxygenated region and the second oxygenated region include a part of the channel supplying layer.

3. A high electron mobility transistor (HEMT), comprising:
 a channel layer;
 a channel supplying layer configured to induce a 2-dimensional electron gas (2DEG) channel in the channel layer;
 a source electrode, a gate electrode and a drain electrode on the channel layer and the channel supplying layer;
 at least one of a channel increasing layer and an insulating layer on the channel supplying layer, the channel increasing layer increasing a concentration of the 2DEG;
 an oxygenated region adjacent to the gate electrode,
  the oxygenated region including an oxidized product of a material of the channel supplying layer,
  the oxygenated region including one of,
   an oxidized product of a material of the channel increasing layer, and
   an oxidized product of a material of the insulating layer; and
 a semiconductor layer of less polarizability than a polarizability of the channel supplying layer, the semiconductor layer between the channel supplying layer and the at least one of the channel increasing layer and the insulating layer,
 wherein at least part of the oxygenated region includes a part of both the at least one of the channel increasing layer and the insulating layer and the semiconductor layer.

4. The HEMT of claim 3, wherein the at least one of the channel increasing layer and the insulating layer includes the oxygenated region, and
 the channel increasing layer includes one of a Group IV semiconductor, a compound of the Group IV semiconductor, an n-type semiconductor and a dielectric material.

5. The HEMT of claim 3, wherein the insulating layer includes one of $Al_2O_3$, $SiO_2$ and SiN.

6. The HEMT of claim 1, wherein
 at least one of a length and an oxygen concentration of the second oxygenated region is less than a corresponding one of a length and an oxygen concentration of the first oxygenated region.

7. The HEMT of claim 3, wherein
 the HEMT includes the insulating layer, and
 at least part of the oxygenated region is covered by the insulating layer.

8. The HEMT of claim 1, further comprising:
 a first semiconductor layer of less polarizability than a polarizability of the channel supplying layer, the first semiconductor layer between the gate electrode and the channel supplying layer,
 wherein at least one of the first oxygenated region and the second oxygenated region includes a part of the first semiconductor layer.

9. The HEMT of claim 8, further comprising:
 a second semiconductor layer of greater polarizability than a polarizability of the channel layer, the channel layer between the second semiconductor layer and the gate.

10. The HEMT of claim 1, further comprising:
 a semiconductor layer of greater polarizability than a polarizability of the channel layer, the channel layer between the semiconductor layer and the gate.

11. A high electron mobility transistor (HEMT), comprising:
 a channel layer;
 a channel supplying layer configured to induce a 2-dimensional electron gas (2DEG) channel in the channel layer;
 a source electrode, a gate electrode and a drain electrode on the channel layer and the channel supplying layer;
 at least one of a channel increasing layer and an insulating layer on the channel supplying layer, the channel increasing layer increasing a concentration of the 2DEG;
 an oxygenated region adjacent to the gate electrode,
  the oxygenated region including an oxidized product of a material of the channel supplying layer,
  the oxygenated region including one of,
   an oxidized product of a material of the channel increasing layer, and
   an oxidized product of a material of the insulating layer; and
 a semiconductor layer of greater polarizability than a polarizability of the channel layer, the channel layer between the semiconductor layer and the gate electrode.

12. A method of manufacturing a high electron mobility transistor (HEMT), the method comprising:
 forming a channel layer on a substrate;
 forming a channel supplying layer on the channel layer to induce a 2-dimensional electron gas (2DEG) channel in the channel layer;
 forming a source electrode and a drain electrode on the channel supplying layer, the source and drain electrodes spaced apart from each other;
 forming an oxygenated region on the channel supplying layer between the source electrode and the drain electrode, the forming an oxygenated region including oxidizing a part of the channel supplying layer; and
 forming a gate electrode on at least one of the oxygenated region and a region of the channel supplying layer between the oxygenated region and the source electrode,
 wherein the forming of the oxygenated region includes forming a first oxygenated region and a second oxygenated region,
  the first oxygenated region is between the gate electrode and the channel layer,
  the second oxygenated region is between the drain electrode and the gate electrode, and
  the second oxygenated region is not in contact with the drain electrode.

13. The method of claim 12, wherein at least one of lengths and oxygen concentrations of the first and second oxygenated regions are different from each other.

14. The method of claim 12, wherein the forming of the oxygenated region includes forming the first and second oxygenated regions to partially overlap each other.

15. The method of claim 12, further comprising:
forming at least one of a channel increasing layer and an insulating layer on the channel supplying layer prior to the forming of the gate electrode.

16. The method of claim 15, wherein the forming of the at least one of the channel increasing layer and the insulating layer includes forming the channel increasing layer, and
the channel increasing layer includes one of a Group IV semiconductor, a compound of a Group IV semiconductor, an n-type semiconductor and a dielectric material.

17. The method of claim 15, wherein the forming of the at least one of the channel increasing layer and the insulating layer includes forming the insulating layer, and
the insulating layer includes one of $Al_2O_3$, $SiO_2$ and SiN.

18. The method of claim 12, wherein at least one of the length and oxygen concentration of the second oxygenated region is less than a corresponding one of the length and oxygen concentration of the first oxygenated region, and
the forming of the gate electrode includes forming the gate electrode on the first oxygenated region.

19. The method of claim 12, further comprising:
forming a first semiconductor layer of less polarizability than a polarizability of the channel supplying layer on the channel supplying layer prior to the forming of the gate electrode,
wherein the forming of the oxygenated region includes forming the oxygenated region through the first semiconductor layer.

20. The method of claim 19, further comprising:
forming a second semiconductor layer having greater polarizability than polarizability of the channel layer,
wherein the forming of the channel layer includes forming the channel layer on the second semiconductor layer.

21. The method of claim 15, further comprising:
forming a first semiconductor layer of less polarizability than a polarizability of the channel supplying layer on the channel supplying layer prior to the forming of the at least one of the channel increasing layer and the insulating layer.

22. The method of claim 21, further comprising:
forming a second semiconductor layer of greater polarizability than a polarizability of the channel layer,
wherein the forming of the channel layer includes forming the channel layer on the second semiconductor layer.

23. The method of claim 12, wherein the forming of the oxygenated region includes forming the oxygenated region by using one of $O_2$ plasma, $O_2$ annealing, $O_3$, ultraviolet (UV) oxidation, O radical and O implant.

24. The HEMT of claim 3, wherein a width of oxygenated region is less than a width of the at least one of the channel increasing layer and the insulating layer.

* * * * *